(12) United States Patent
Dokania et al.

(10) Patent No.: US 12,412,611 B1
(45) Date of Patent: Sep. 9, 2025

(54) TIME DECOUPLED WRITE OPERATIONS FOR NON-LINEAR POLAR MATERIAL BASED MEMORY

(71) Applicant: Kepler Computing Inc., San Francisco, CA (US)

(72) Inventors: Rajeev Kumar Dokania, Beaverton, OR (US); Pramod Kolar, Cary, NC (US); Mustansir Yunus Mukadam, Seattle, WA (US); Darshak Doshi, Sunnyvale, CA (US); Biswajeet Guha, Hillsboro, OR (US); Tanay Gosavi, Portland, OR (US); Amrita Mathuriya, Portland, OR (US); Debo Olaosebikan, San Francisco, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 134 days.

(21) Appl. No.: 18/309,616

(22) Filed: Apr. 28, 2023

(51) Int. Cl.
G11C 11/22 (2006.01)
G06F 3/06 (2006.01)

(52) U.S. Cl.
CPC ........ *G11C 11/2275* (2013.01); *G06F 3/0616* (2013.01); *G06F 3/0659* (2013.01); *G06F 3/0673* (2013.01); *G11C 11/221* (2013.01); *G11C 11/2297* (2013.01)

(58) Field of Classification Search
CPC .............. G11C 11/2275; G11C 11/221; G11C 11/2279
See application file for complete search history.

(56) References Cited

U.S. PATENT DOCUMENTS

| 8,811,057 B1 * | 8/2014 | Madan ................ G11C 11/2297 365/229 |
| 2003/0086312 A1 * | 5/2003 | Kang ...................... G11C 11/22 365/200 |
| 2012/0127776 A1 * | 5/2012 | Kawashima ........ G11C 11/2273 365/145 |
| 2018/0350421 A1 * | 12/2018 | Kawamura ........... G11C 11/221 |

* cited by examiner

*Primary Examiner* — Han Yang
(74) *Attorney, Agent, or Firm* — MUGHAL GAUDRY & FRANKLIN PC

(57) ABSTRACT

Described herein is a read and write scheme to improve memory reliability. In at least one embodiment, one or more circuitries are provided to perform logic 0 write operation in a first phase and logic 1 write operation in a second phase for a plurality of bit-cells controlled by a word-line. In at least one embodiment, an individual bit-cell comprises a transistor having a gate terminal coupled to the word-line; and a capacitor including non-linear polar material, wherein the capacitor has a first terminal coupled to a plate-line and a second terminal coupled to the transistor, wherein a source or drain terminal of the transistor is coupled to a bit-line.

25 Claims, 24 Drawing Sheets

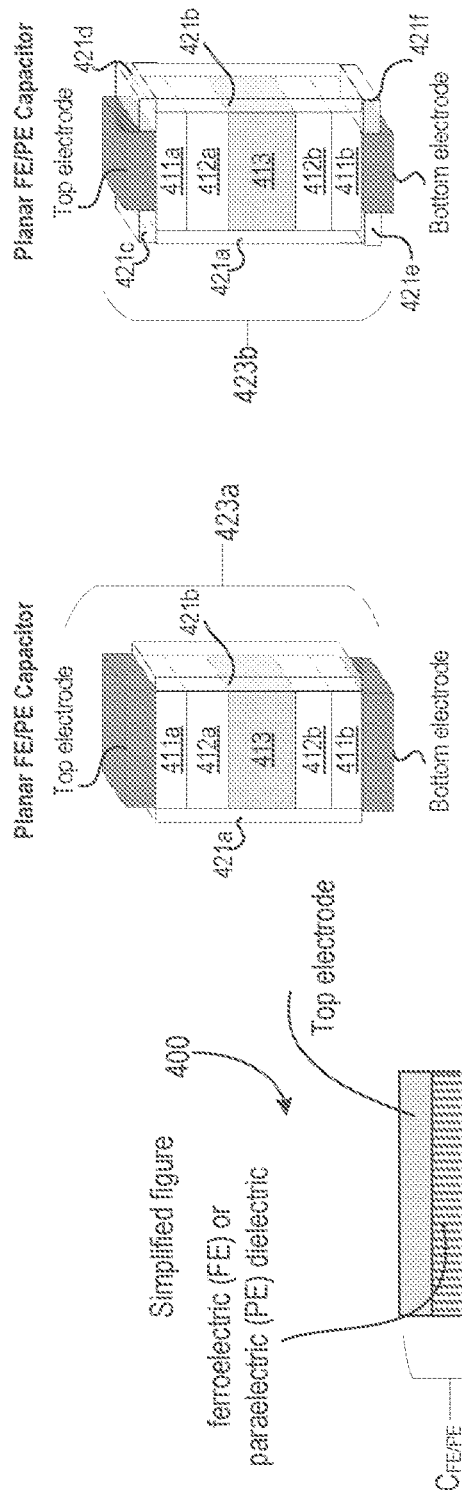
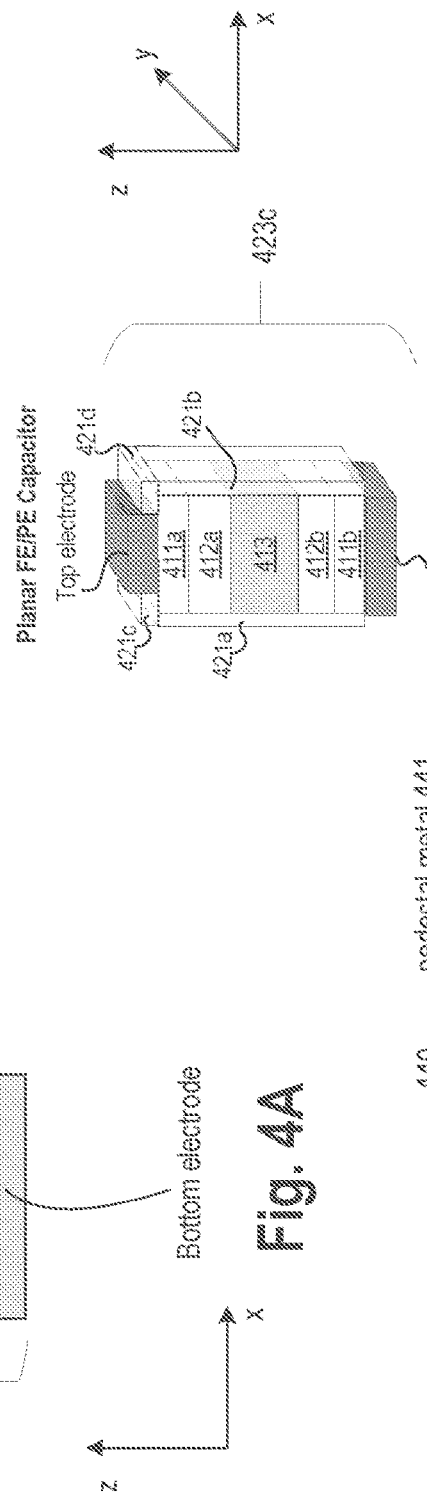
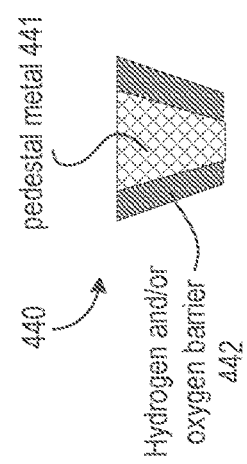
Fig. 4A
Fig. 4B
Fig. 4C

TIME DECOUPLED WRITE OPERATIONS FOR NON-LINEAR POLAR MATERIAL BASED MEMORY

BACKGROUND

Memory bit-cells are arranged in rows and columns that form segments, arrays, or banks. To access a bit-cell in a bank or array, a word-line is asserted to select a row or column in the bank or array where the bit-cell resides. To program a bit-cell having a capacitor, a voltage is developed across it after word-line is activated (e.g., asserted or de-asserted depending on conductivity type of access transistor of the bit-cell). As supply voltage or operating voltage is being lowered for low power applications, effective voltage across the capacitor during write operation is also lowered. Lower voltage across the capacitor to program it may not result in reliable programming. This presents a challenge in programming a bit-cell capacitor.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or a paraelectric capacitor structure, in accordance with at least one embodiment.

FIG. 4B illustrates three planar ferroelectric or paraelectric capacitor structures, respectively, in accordance with at least one embodiment.

FIG. 4C illustrates a pedestal that connects to the top and/or bottom electrodes of the planar ferroelectric or paraelectric capacitor, in accordance with at least one embodiment.

DETAILED DESCRIPTION

Figure 1:
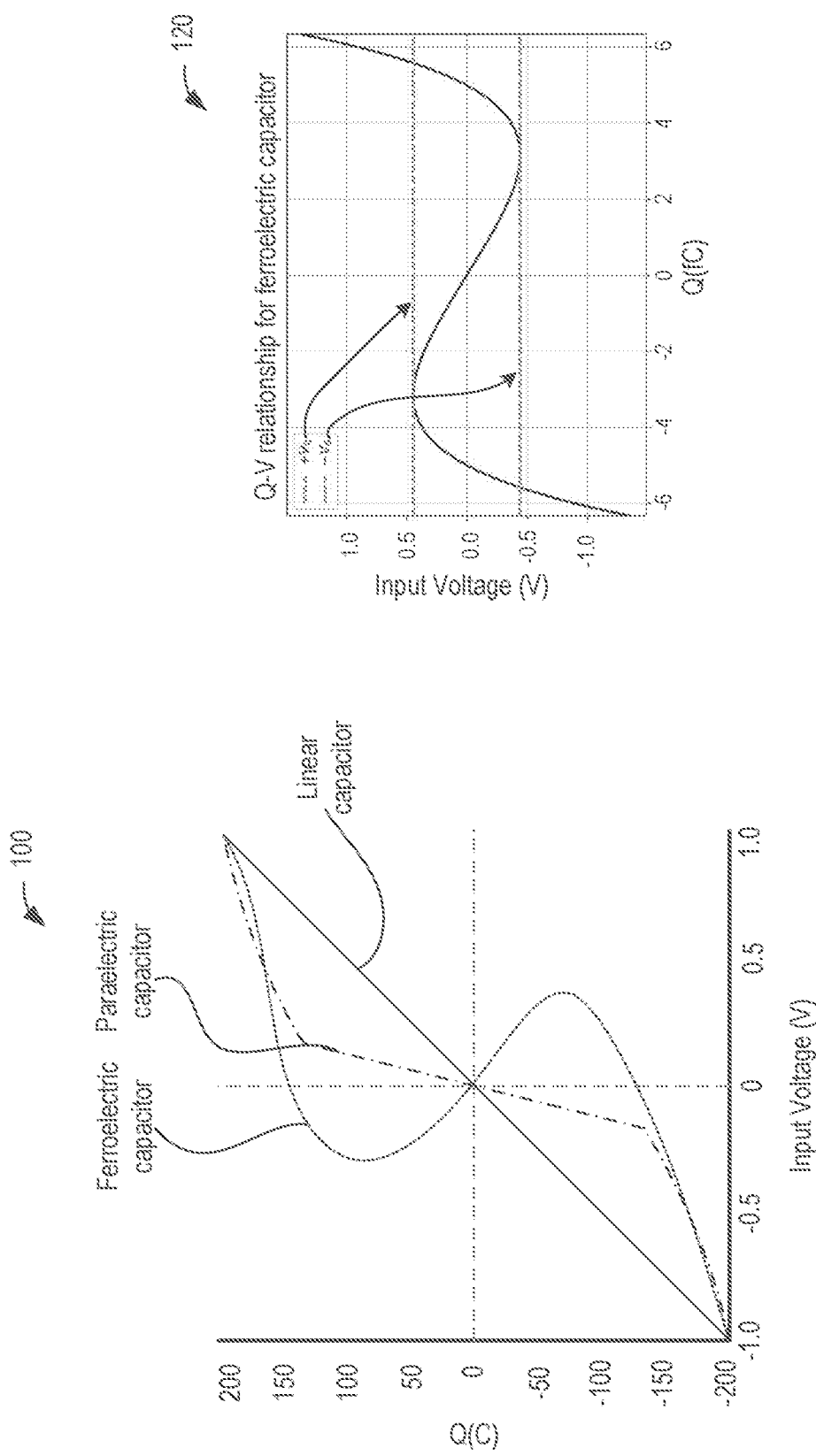
FIG. 1 illustrates a set of plots that show behavior of a ferroelectric capacitor, a paraelectric capacitor, and a linear capacitor.

Storage endurance in a capacitor comprising non-linear polar material such as ferroelectric material, paraelectric material, or non-linear dielectric depends on several factors including electric displacement and polarization (dp). More reliable switching of states in a capacitor can be achieved when variation in dp is reduced, in accordance with at least one embodiment. In at least one embodiment, one or more circuitries are provided that allow for fully saturated dp in a capacitor of a one-transistor one-capacitor (1T1C) bit-cell. In at least one embodiment, when a capacitor is being written to, access transistor associated or coupled to capacitor is driven by a word-line at higher voltage than nominal supply voltage Vdd. Here, "nominal supply voltage" generally refers to a supply voltage that is specified by a process technology node as being reliable for a transistor. In at least one embodiment, a transistor operating on a nominal supply voltage may not observe oxide breakdown and/or electro-migration effects for a specified period.

In at least one embodiment, a capacitor in a bit-cell is replaced with a memory element. In at least one embodiment, a memory element is one of a magnetic tunneling junction (MTJ), resistive device, phase-change device, etc. In at least one embodiment, a capacitor of a bit-cell comprises a non-linear polar material. In at least one embodiment, non-linear polar material is one of a ferroelectric, a paraelectric, or a non-linear dielectric material. In at least one embodiment, non-linear polar material is doped one or more elements of a 3d, 4d, 5d, 6d, 4f, and 5f series of a periodic table.

In at least one embodiment, an access transistor of a bit-cell is operated at a voltage higher than nominal supply voltage. In at least one embodiment, word-line connected to a gate terminal of an access transistor is adjusted to a voltage higher than nominal supply voltage. In at least one embodiment, voltage on word-line is adjusted to a maximum allowable supply voltage specified by a process technology node plus a threshold voltage of access transistor. In at least one embodiment, voltage on word-line is at least a threshold voltage above nominal supply voltage. In at least one embodiment, voltage on bit-line connected to source or drain of an access transistor can be as high as nominal supply voltage or maximum allowable supply voltage. In at least one embodiment, voltage difference between gate and source of access transistor (e.g., Vgs) or gate and drain (e.g., Vds) of access transistor is about a threshold voltage, which prevents from any possible breakdown of access transistor.

In at least one embodiment, by operating voltage on word-line connected to gate of access transistor to be at least a nominal supply voltage plus threshold voltage of access transistor, threshold drop in voltage from bit-line to capacitor is avoided. In at least one embodiment, capacitor connected to access transistor receives voltage on bit-line (e.g., nominal supply voltage) during write 1 operation. As such, fully saturated dp is provided to capacitor.

In at least one embodiment, logic 1 write operation and logic 0 write operation are timewise decoupled for bit-cells that share same word-line. In at least one embodiment, a write cycle comprises a first phase for logic 0 write operation and a second phase for logic 1 write operation. In at least one embodiment, first phase occurs before second phase. In at least one embodiment, first phase occurs after second phase. In at least one embodiment, logic 0 write operation may not need word-line to be at nominal supply voltage plus threshold voltage of access transistor. In at least one embodiment, voltage on word-line for logic 0 write operation is at nominal supply voltage level.

In at least one embodiment, bit-cells in a row or column of a memory array that share same word-line are written logic 1 and logic 0 values in different phases. In at least one embodiment, bit-cells that are to be written 0 are identified and logic 0 is written to them in logic 0 write operation, where voltage on word-line is at nominal supply voltage level. In at least one embodiment, bit-cells that are to be written 1 are identified and logic 1 is written to them in logic 1 write operation, where voltage on word-line is higher than nominal supply voltage level. In at least one embodiment, logic 0 write operation phase occurs prior to logic 1 write operation phase. In at least one embodiment, logic 1 write operation phase occurs prior to logic 0 write operation phase.

In at least one embodiment, read operation comprises a read phase followed by a writeback phase and then a standby phase. In at least one embodiment, writeback phase comprises write operation as discussed herein to writeback same value that is read out. In at least one embodiment, writeback phase comprises logic 1 write operation phase since read phase is effectively like a logic 0 write operation phase since word-line operates at nominal supply voltage level.

Here, numerous details are discussed to provide a more thorough explanation of at least one embodiment. It will be apparent, however, to one skilled in art, that at least one embodiment may be practiced without these specific details. In other instances, well-known structures and devices are shown in block diagram form, rather than in detail, to avoid obscuring at least one embodiment.

Note that in corresponding drawings of at least one embodiment, signals are represented with lines. Some lines may be thicker, to indicate more constituent signal paths, and/or have arrows at one or more ends, to indicate primary information flow direction. Such indications are not intended to be limiting. Rather, lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of figures with same reference numbers (or names) as elements of any other figure can operate or function in any manner like that described but are not limited to such.

FIG. 1 illustrates a set of plots showing behavior of a ferroelectric capacitor, a ferroelectric capacitor, and a linear capacitor, in accordance with at least one embodiment. Plot 100 compares transfer function for a linear capacitor, a paraelectric (PE) capacitor (a nonlinear capacitor) and a ferroelectric (FE) capacitor (a nonlinear capacitor). Here, x-axis is input voltage or voltage across a capacitor, while y-axis is charge on a capacitor. In at least one embodiment, ferroelectric (FE) material can be any suitable low voltage FE material that allows FE material to switch its state by a low voltage (e.g., 100 mV). In at least one embodiment, threshold in FE material has a highly nonlinear transfer function in polarization versus voltage response. In at least one embodiment, threshold is related to: a) nonlinearity of switching transfer function; and b) squareness of FE switching. In at least one embodiment, nonlinearity of switching transfer function is width of derivative of polarization versus voltage plot. In at least one embodiment, squareness is defined by a ratio of remnant polarization to saturation polarization, where perfect squareness will show a value of 1. In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a nonlinear dielectric. In at least one embodiment, squareness of FE switching can also be changed by granularity of an FE layer. In at least one embodiment, a perfectly epitaxial, single crystalline FE layer may show higher squareness (e.g., ratio is closer to 1)

compared to a polycrystalline FE. In at least one embodiment, perfect epitaxial can be accomplished using lattice matched bottom and top electrodes. In at least one embodiment, BiFeO (BFO) can be epitaxially synthesized using a lattice matched $SrRuO_3$ bottom electrode yielding P-E loops that are square. In at least one embodiment, progressive doping with La may reduce squareness.

Plot 120 shows charge and voltage relationship for a ferroelectric capacitor, in accordance with at least one embodiment. In at least one embodiment, a capacitor with ferroelectric material is a nonlinear capacitor with its potential $V_F(Q_F)$ as a cubic function of its charge. Plot 120 illustrates characteristics of an FE material, in accordance with at least one embodiment. Plot 120 is a charge-voltage (Q-V) plot for a block of $Pb(Zr_{0.5}Ti_{0.5})O_3$ of area $(100\,nm)^2$ and thickness 30 nm (nanometer), in accordance with at least one embodiment. Plot 120 shows local extrema at $+/-V_o$ indicated by dashed lines. Here, $V_c$ is coercive voltage. In applying a potential V across an FE material, its charge can be unambiguously determined for $|V|>V_o$. Otherwise, charge of an FE material is subject to hysteresis effects.

In at least one embodiment, FE material comprises a perovskite of type $ABO_3$, where 'A' and 'B' are two cations of different sizes, and 'O' is oxygen which is an anion that bonds to both cations. Generally, size of atoms of A is larger than size of B atoms. In at least one embodiment, FE material can be replaced with a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table. In at least one embodiment, non-linear polar material includes perovskite that can be doped (e.g., by La or lanthanides). In least one embodiment, non-linear polar material includes lead zirconium titanate (PZT) or PZT with a first doping material, wherein the first doping material is one of La or Nb. In least one embodiment, non-linear polar material includes bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of periodic table.

In at least one embodiment, non-linear polar material includes a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST). In at least one embodiment, non-linear polar material includes hexagonal ferroelectric which includes one of: $YMnO_3$ or $LuFeO_3$. In at least one embodiment, non-linear polar material includes hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides.

In at least one embodiment, non-linear polar material includes hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y. In at least one embodiment, non-linear polar material includes $HfO_2$ doped with $E_y$, where E includes one of Al, Ca, Ce, Dy, Er, Gd, Ge, La, Sc, Si, Sr, Sn, or Y, and wherein 'y' is a fraction. In at least one embodiment, non-linear polar material includes Al(1-x)Sc(x)N, Ga(1-x)Sc(x)N, Al(1-x)Y(x)N or Al(a)Mg(b)Nb(c)N, wherein a, b, and c are respective compositional fractions. In at least one embodiment, non-linear polar material includes niobate type compounds including $LiNbO_3$, $LiTaO_3$, $LiTaO_2F_2$, $Sr_xBa1-xNb_2O_6$ where $0.32 \leq x \leq 0.8$, or $KSr_2Nb_5O_{15}$. In at least one embodiment, non-linear polar material includes an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100. In at least one embodiment, non-linear polar material includes a paraelectric material that comprises $SrTiO_3$, $Ba(x)Sr(y)TiO_3$, $HfZrO_2$, Hf—Si—O, or a PMN-PT based relaxor ferroelectrics.

In at least one embodiment, FE material is perovskite, which includes one or more of: La, Sr, Co, Sr, Ru, Y, Ba, Cu, Bi, Ca, or Ni. In at least one embodiment, metallic perovskites such as (La,Sr)$CoO_3$, $SrRuO_3$, (La,Sr)$MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used as FE material. In at least one embodiment, perovskites can be suitably doped to achieve a spontaneous distortion in a range of 0.3% to 2%. In at least one embodiment, for chemically substituted lead titanate such as Zr in Ti site; and La or Nb in Ti site, concentration of these substitutes is such that it achieves spontaneous distortion in range of 0.3% to 2%. In at least one embodiment, for chemically substituted $BiFeO_3$, $BrCrO_3$, or $BuCoO_3$ class of materials, La or rare earth substitution into Bi site can tune spontaneous distortion. In at least one embodiment, FE material is contacted with a conductive metal oxide that includes one of conducting perovskite metallic oxides exemplified by: La—Sr—CoO3, SrRuO3, La—Sr—MnO3, YBa2Cu3O7, Bi2Sr2CaCu2O8, and LaNiO3.

In at least one embodiment, FE material comprises a stack of layers including low voltage FE material between conductive oxides. In at least one embodiment, when FE material is a perovskite, conductive oxides are of type AA'BB'$O_3$. A' is a dopant for atomic site A, it can be an element from lanthanides series. B' is a dopant for atomic site B, it can be an element from transition metal elements, such as Sc, Ti, V, Cr, Mn, Fe, Co, Ni, Cu, or Zn. In at least one embodiment, A' may have same valency of site A, with a different ferroelectric polarizability. In at least one embodiment, when metallic perovskite is used for FE material, conductive oxides can include one or more of: $IrO_2$, $RuO_2$, $PdO_2$, $OsO_2$, or $ReO_3$. In at least one embodiment, perovskite is doped with La or lanthanides. In at least one embodiment, thin layer (e.g., approximately 10 nm) perovskite template conductors such as SrRuO3 coated on top of IrO2, RuO2, PdO2, and PtO2, which have a non-perovskite structure but higher conductivity to provide a seed or template for growth of pure perovskite ferroelectric at low temperatures, are used as conductive oxides. In at least one embodiment, conductive oxides include one or more of: Ir, In, Fe, Ru, Pd, Os, or Re.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. In at least one embodiment, room temperature paraelectric materials include: SrTiO3, Ba(x)Sr(y)TiO3 (where x may be, for example, −0.05 or 0.5, and y may be for example, 0.95), HfZrO2, Hf—Si—O, La-substituted PbTiO3, or PMN-PT based relaxor ferroelectrics.

In at least one embodiment, FE material comprises one or more of: hafnium (Hf), zirconium (Zr), aluminum (Al), silicon (Si), their oxides, or their alloyed oxides. In at least one embodiment, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' or 'y' is a fraction. In at least one embodiment, FE material includes one or more of: bismuth ferrite (BFO), lead zirconate titanate (PZT), BFO with a first doping material, or PZT with a second doping material, wherein doping material is one of Nb or La; and relaxor ferroelectrics such as PMN-PT.

In at least one embodiment, FE material includes bismuth ferrite (BFO) with a first doping material wherein the first doping material is one of lanthanum, any element from lanthanide series of periodic table, or one or more elements of a 3d, 4d, 5d, 6d, 4f, and 5f series of periodic table. In at least one embodiment, FE material includes lead zirconium titanate (PZT) or PZT with a second doping material, wherein the second doping material is one of La or Nb. In at least one embodiment, FE material includes a relaxor ferroelectric including one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one embodiment, FE material includes hafnium oxides of form, Hf1-x ExOy where E can be Al, Ca, Ce, Dy, Er, Gd, Ge, La, Sc, Si, Sr, Sn, or Y. In at least one embodiment, FE material includes Niobate type compounds LiNbO3, LiTaO3, lithium iron tantalum oxy fluoride, barium strontium niobate, sodium barium niobate, or potassium strontium niobate.

In at least one embodiment, FE material comprises multiple layers. In at least one embodiment, alternating layers of [Bi2O2]2+, and pseudo-perovskite blocks (Bi4Ti3O12 and related Aurivillius phases), with perovskite layers that are 'n' octahedral layers in thickness can be used. In at least one embodiment, FE material comprises organic material. In at least one embodiment, FE material comprises polyvinylidene fluoride or polyvinylidene difluoride (PVDF).

In at least one embodiment, FE material comprises hexagonal ferroelectrics of type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In at least one embodiment, ferroelectric phase is characterized by a buckling of layered MnO5 polyhedra, accompanied by displacements of Y ions, which lead to a net electric polarization. In at least one embodiment, hexagonal FE includes one of: YMnO3 or LuFeO3. In at least one embodiment, when FE material comprises hexagonal ferroelectrics, conductive oxides are of A2O3 (e.g., In2O3, Fe2O3) and ABO3 type, where 'A' is a rare earth element and B is Mn.

In at least one embodiment, FE material comprises improper FE material. An improper ferroelectric is a ferroelectric where primary order parameter is an order mechanism such as strain or buckling of atomic order. In at least one embodiment, improper FE material are LuFeO3 class of materials or super lattice of ferroelectric and paraelectric materials PbTiO3 (PTO) and SnTiO3 (STO), respectively, and LaAlO3 (LAO) and STO, respectively. In at least one embodiment, a super lattice of [PTO/STO]n or [LAO/STO]n, where 'n' is between 1 and 100. In at least one embodiment, paraelectric material includes one of: SrTiO3, Ba(x)Sr(y)TiO3 (where x may be, for example, −0.5, and y may be, for example, 0.95), BaTiO3, HfZrO2, Hf—Si—O, La-substituted PbTiO3, or PMN-PT based relaxor ferroelectrics.

Figure 2:
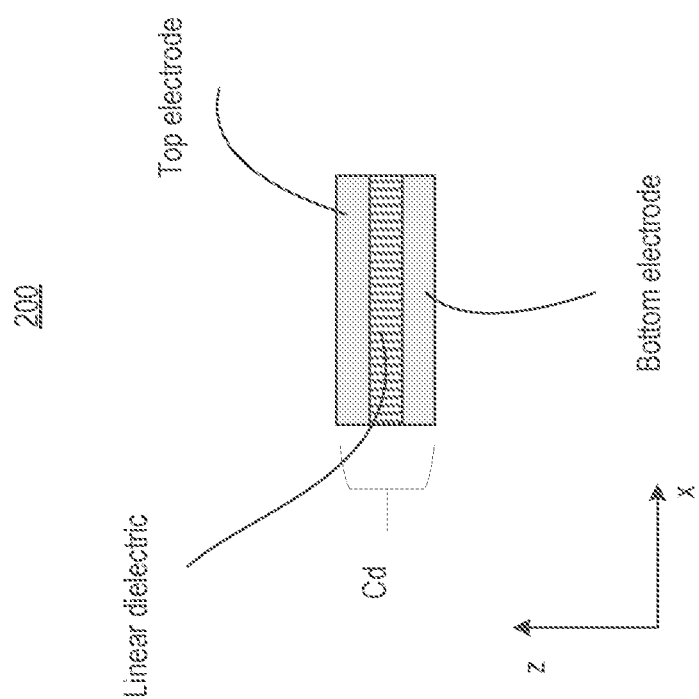
FIG. 2 illustrates a planar linear capacitor structure, in accordance with at least one embodiment.

FIG. 2 illustrates planar capacitor structure 200, in accordance with at least one embodiment. In at least one embodiment, capacitors for multi-input capacitive structures are linear capacitors. In at least one embodiment, capacitors can take any planar form. One such form is illustrated in FIG. 2, in accordance with at least one embodiment. In at least one embodiment, planar capacitor structure 200 is a metal-insulator-metal (MIM) capacitor comprising a bottom electrode, a top electrode, and a linear dielectric between top electrode and bottom electrode as shown. In at least one embodiment, conductive oxide layer(s) are formed between bottom electrode and linear dielectric. In at least one embodiment, conductive oxide layer(s) are formed between top electrode and linear dielectric. In at least one embodiment, conductive oxides include: $IrO_2$, $RuO_2$, $PdO_2$, $OsO_2$, or $ReO_3$. In at least one embodiment, conductive oxides are of form A2O3 (e.g., In2O3, Fe2O3) and ABO3 type, where 'A' is a rare earth element and 'B' is Mn.

In at least one embodiment, dielectric layer includes one or more of: SiO2, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

Figure 3A:
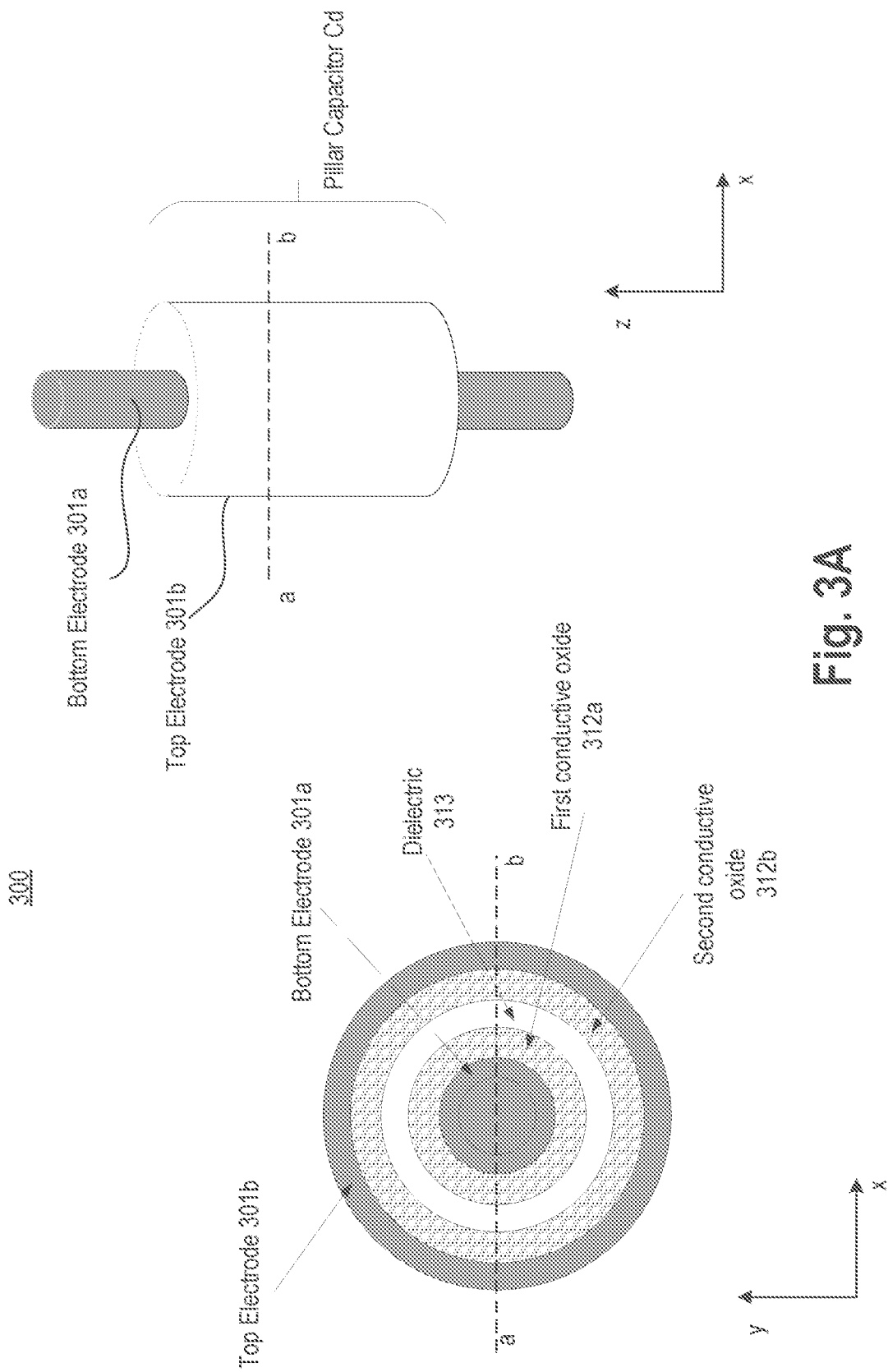
FIG. 3A illustrates a non-planar linear capacitor structure, in accordance with at least one embodiment.

FIG. 3A illustrates non-planar capacitor structure 300, in accordance with at least one embodiment. In at least one embodiment, non-planar capacitor structure 300 is rectangular in shape. Taking cylindrical shaped case, in at least one embodiment, layers of non-planar capacitor structure 300 from center going outwards include bottom electrode 301a, first conductive oxide 312a, dielectric material 313, second conductive oxide 312b, and top electrode 301b. A cross-sectional view along "ab" dashed line is illustrated in middle of FIG. 3A. In at least one embodiment, conducting oxides are removed and linear dielectric is directly connected to top electrode 301b and bottom electrodes 301a. In at least one embodiment, dielectric material 313 can include any suitable linear dielectric, where thickness of dielectric film is a range of 1 nm to 20 nm. In at least one embodiment, linear dielectric material 313 comprises a higher-K dielectric material. In at least one embodiment, linear dielectrics include one of: $SIO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In at least one embodiment, first conductive oxide 312a is conformally deposited over bottom electrode 301a. In at least one embodiment, dielectric material 313 is conformally deposited over first conductive oxide 312a. In at least one embodiment, second conductive oxide 312b is conformally deposited over dielectric material 313. In at least one embodiment, top electrode 301b is conformally deposited over second conductive oxide 312b. In at least one embodiment, bottom electrode 301a is in center while top electrode 301b is on an outer circumference of non-planar capacitor structure 300.

In at least one embodiment, material for bottom electrode 301a may include one or more of: Cu, Al, Ag, Au, W, or Co, or their alloys. In at least one embodiment, material for first conductive oxide 312a include: $IrO_2$, $RuO_2$, $PdO_2$, $OsO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 312b may be same as material for first conductive oxide 312a. In at least one embodiment, material for top electrode 301b may include one or more of: Cu, Al, Ag, Au, W, or Co, or their alloys.

In at least one embodiment, a first refractive intermetallic layer (not shown) is formed between dielectric material 313 and first conductive oxide 312a. In at least one embodiment, second refractive intermetallic layer (not shown) is formed between dielectric capacitor material 313 and second conductive oxide 312b. In at least one embodiment, first and second refractive intermetallic layers are directly adjacent to their respective conductive oxide layers and to dielectric capacitor material 313. In at least one embodiment, refractive intermetallic maintains capacitive properties of dielectric capacitor material 313. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, $TiAl_3$; Ni—Al such as $Ni_3Al$, $NiAl3$, NiAl; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase y alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, and Mg can markedly enhance other properties. In at least one embodiment, thicknesses of layers of non-planar capacitor structure 300 in x-axis are in range of 1 nm to 30 nm. In at least one embodiment, refractive intermetallic layers are not used for non-planar capacitor structure 300.

Figure 3B:
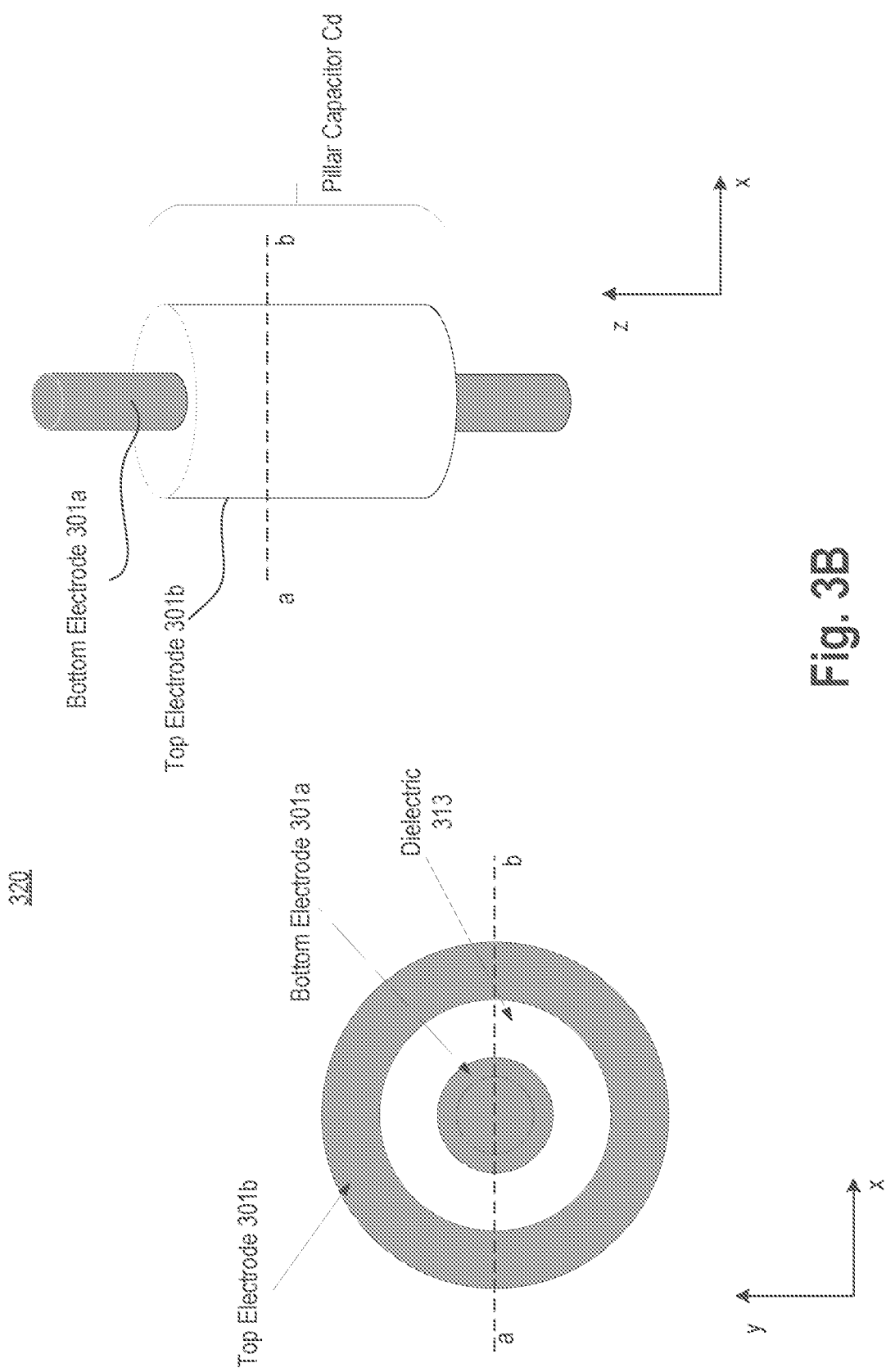
FIG. 3B illustrates a non-planar linear capacitor structure without conductive oxides, in accordance with at least one embodiment.

FIG. 3B illustrates a non-planar linear capacitor structure 320 without conductive oxides, in accordance with at least one embodiment. Compared to FIG. 3A, in at least one embodiment, linear dielectric is adjacent to top electrode and bottom electrode.

FIG. 4A illustrates a planar ferroelectric or a paraelectric capacitor structure, in accordance with at least one embodiment. FIG. 4B illustrates three planar ferroelectric or paraelectric capacitor structures, respectively, in accordance with at least one embodiment.

In at least one embodiment, capacitors are ferroelectric or paraelectric capacitors. In at least one embodiment, capacitors can take any planar form. One such simplified form is illustrated in FIG. 4A, in accordance with at least one embodiment. In at least one embodiment, planar capacitor structure 400 is a metal-insulator-metal (MIM) capacitor comprising a bottom electrode, a top electrode, and a ferroelectric dielectric between top electrode and bottom electrode as shown. In at least one embodiment, conductive oxide layer(s) are formed between bottom electrode and ferroelectric dielectric.

In at least one embodiment, planar capacitor 423a includes encapsulation portions 421a and 421b (also referred to as sidewall barrier seal) that are adjacent to side walls of plurality of layers of planar capacitor. In at least one embodiment, planar capacitor 423c includes encapsulation portions 421c and 421d that are partially adjacent to encapsulation portions 421a and 421b, and refractive intermetallic 411a. In at least one embodiment, encapsulation portions 421a and 421b extend in z-plane. In at least one embodiment, encapsulation portions 421c and 421d terminate into a via (not shown). In at least one embodiment, material for encapsulation portions 421c and 421d is same as those for encapsulation portions 421a and 421b. In at least one embodiment, barrier material for encapsulation portions 421a and 421b includes one or more of an oxide of: Ti, Al, or Mg.

In at least one embodiment, planar capacitor 423b includes encapsulation portions 421e and 421f that are partially adjacent to encapsulation portions 421a and 421b, and refractive intermetallic 411b. In at least one embodiment, encapsulation portions 421e and 421f terminate into a via (not shown). In at least one embodiment, encapsulation portions 421e and 421f extend in an x-plane. In at least one embodiment, material for encapsulation portions 421e and 421f is same as those for encapsulation portions 421a and 421b. In at least one embodiment, material for encapsulation portions 421a and 421b includes one or more of: Ti—Al—O, $Al_2O_3$, MgO, or nitride. In at least one embodiment, material for encapsulation portions 421a and 421b is a sidewall barrier (e.g., insulative material) that protects stack of layers from hydrogen and/or oxygen diffusion. In at least one embodiment, sidewall barrier material is not an inter-layer dielectric (ILD) material. In at least one embodiment, lateral thickness (along x-axis) of encapsulation portions 421a and 421b (insulating material) is in a range of 0.1 nm to 20 nm. In at least one embodiment, sidewall barriers are in direct contact with ILD.

In at least one embodiment, planar capacitors 423a, 423b, and 423c comprise several layers stacked together to form a planar capacitor. In at least one embodiment, these layers may extend in an x-plane when capacitor is a planar capacitor. In at least one embodiment, stack of layers includes refractive intermetallic 411a and refractive intermetallic 411b as a barrier material, conductive oxides 412a, conductive oxide 412b, and ferroelectric material 413. In at least one embodiment, ferroelectric material 413 can be any of ferroelectric materials discussed herein. In at least one embodiment, refractive intermetallic 411a and refractive intermetallic 411b are removed, and electrodes are in direct contact with conductive oxide 412a and conductive oxide 412b.

In at least one embodiment, refractive intermetallic 411a and refractive intermetallic 411b maintains ferroelectric properties of ferroelectric capacitor. In absence of refractive intermetallic 411a and refractive intermetallic 411b, ferroelectric material 413 of a capacitor may lose its potency. In at least one embodiment, refractive intermetallic 411a and refractive intermetallic 411b comprises Ti and Al (e.g., TiAl compound). In at least one embodiment, refractive intermetallic 411a and refractive intermetallic 411b comprises one or more of Ta, W, and/or Co. In at least one embodiment, refractive intermetallic 411a and refractive intermetallic 411b includes a lattice of Ta, W, and Co.

In at least one embodiment, refractive intermetallic 411a and refractive intermetallic 411b is part of a barrier layer which is a super lattice of a first material and a second material, wherein first material includes Ti and Al (e.g., TiAl), and second material includes Ta, W, or Co (e.g., layers of Ta, W, and Co together). In at least one embodiment, lattice parameters of barrier layer are matched with lattice parameters of conductive oxides and/or ferroelectric material 413.

In at least one embodiment, refractive intermetallic 411a and refractive intermetallic 411b includes one of: Ti—Al such as $Ti_3Al$, TiAl, or $TiAl_3$; Ni—Al such as $Ni_3Al$, $NiAl_3$, and NiAl; Ni—Ti, Ni—Ga, and $Ni_2MnGa$; FeGa or $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, or Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase y alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta) or combined properties. In at least one embodiment, additions such as Si, B, and Mg can markedly enhance other properties. In at least one embodiment, encapsulation portion 421a is coupled to a top electrode. In at least one embodiment, encapsulation portions 421a and 421b (insulating material) is placed around refractive intermetallic 411a, conductive oxide 412a, ferroelectric material 413, conductive oxide 412b, and refractive intermetallic 411b along while top and bottom surfaces of refractive intermetallic 411a and refractive intermetallic 411b are exposed for coupling to metal layers, vias, or a metallic pedestal.

In at least one embodiment, conductive oxide layer(s) are formed between top electrode and ferroelectric dielectric. In at least one embodiment, conductive oxides include: $IrO_2$, $RuO_2$, $PdO_2$, $OsO_2$, or $ReO_3$. In at least one embodiment, conductive oxides are of form A2O3 (e.g., $In_2O_3$, $Fe_2O_3$) and $ABO_3$ type, where 'A' is a rare earth element and 'B' is Mn. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

FIG. 4C illustrates pedestal 440 that connects to top and/or bottom electrodes of planar ferroelectric or paraelectric capacitor, in accordance with at least one embodiment. In at least one embodiment, pedestal 440 comprises pedestal metal 441 and sidewall barrier 442. In at least one embodiment, barrier 442 includes materials to protect hydrogen and/or oxygen from interacting with pedestal metal 441. In at least one embodiment, barrier 442 comprises Ti—Al—O, $Al_2O_3$, MgO, or nitride. In at least one embodiment, pedestal metal 441 includes one of Cu, Al, Ag, Au, W, or Co.

Figure 5A:
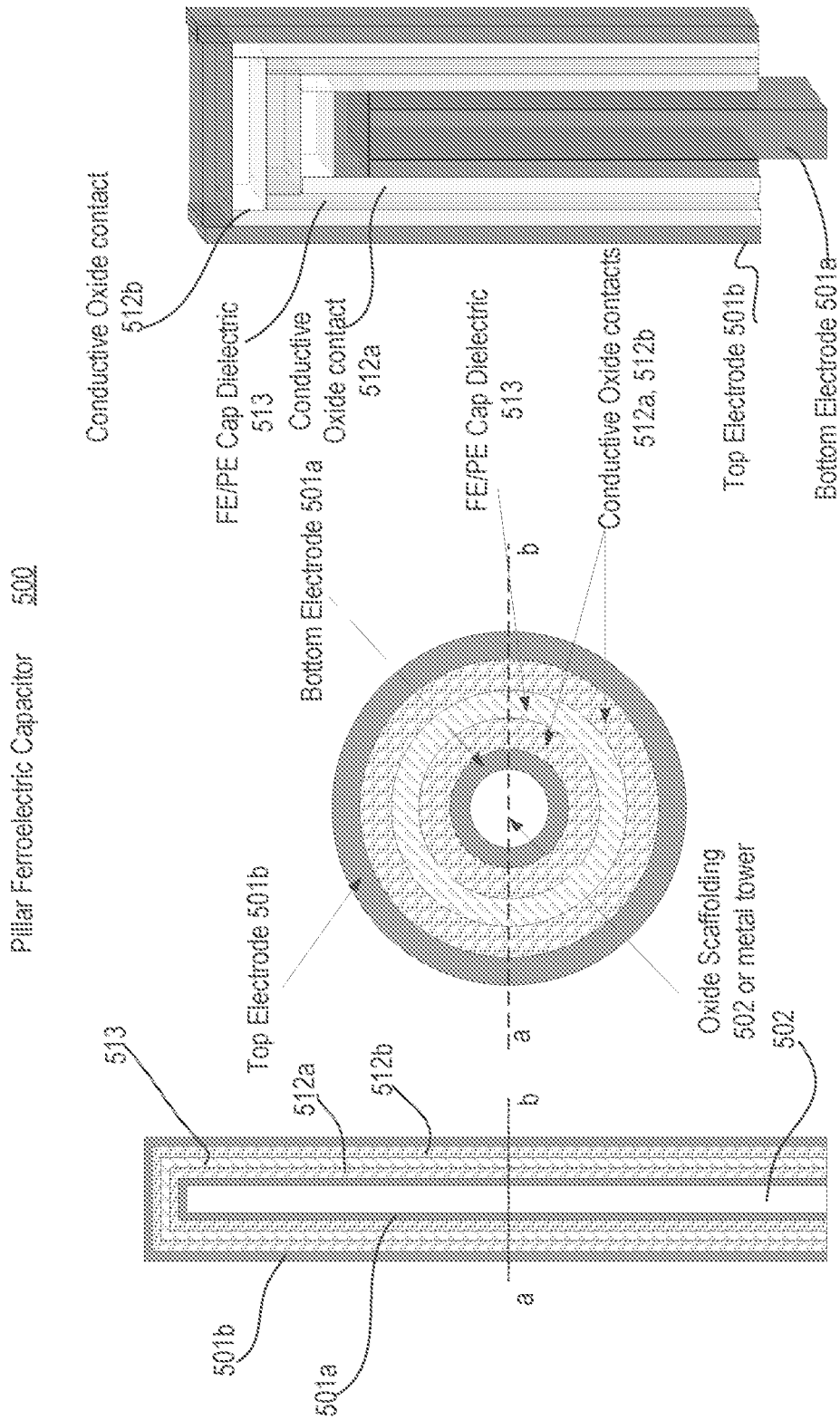
FIG. 5A illustrates a non-planar ferroelectric or a paraelectric capacitor structure, in accordance with at least one embodiment.

FIG. 5A illustrates a non-planar ferroelectric (FE) or paraelectric (PE) capacitor structure, in accordance with at least one embodiment. In at least one embodiment, non-planar capacitor structure 500 is rectangular in shape. Taking cylindrical shaped case, in at least one embodiment, layers of non-planar capacitor structure 500 from center going outwards include bottom electrode 501a, first conductive oxide 512a, ferroelectric (FE) or paraelectric (PE) dielectric material 513, second conductive oxide 512b, and top electrode 501b. In at least one embodiment, conducting oxides are removed and FE/PE dielectric is directly connected to top electrode 501b and bottom electrode 501a. In at least one embodiment, ferroelectric dielectric material 513 can include any suitable dielectric, where thickness of ferroelectric or paraelectric (FE or PE) dielectric film is a range of 1 nm to 20 nm. In at least one embodiment, ferroelectric or paraelectric dielectric material 513 includes any one of materials discussed herein for ferroelectrics or paraelectric. In at least one embodiment, central region 502 of non-planar capacitor structure 500 is filled with oxide or an insulative material. In at least one embodiment, central region 502 is filled with metal that abuts with bottom electrode 501a to form a thicker bottom electrode.

In at least one embodiment, first conductive oxide 512a is conformally deposited over bottom electrode 501a. In at least one embodiment, ferroelectric or paraelectric dielectric material 513 is conformally deposited over first conductive oxide 512a. In at least one embodiment, second conductive oxide 512b is conformally deposited over ferroelectric or paraelectric dielectric material 513. In at least one embodiment, top electrode 501b is conformally deposited over second conductive oxide 512b. In at least one embodiment, bottom electrode 501a is in center while top electrode 501b is on an outer circumference of non-planar capacitor structure 500.

In at least one embodiment, material for bottom electrode 501a may include one or more of: Cu, Al, Ag, Au, W, or Co, or their alloys. In at least one embodiment, material for first conductive oxide 512a include: $IrO_2$, $RuO_2$, $PdO_2$, $OsO_2$, or $ReO_3$. In at least one embodiment, conductive oxides are of form $A_2O_3$(e.g., $In_2O_3$, $Fe_2O_3$) and $ABO_3$ type, where 'A' is a rare earth element and 'B' is Mn. In at least one embodiment, material for second conductive oxide 512b may be same as material for first conductive oxide 512a. In at least one embodiment, material for top electrode 501b may include one or more of: Cu, Al, Ag, Au, W, or Co, or their alloys.

In at least one embodiment, a first refractive intermetallic layer (not shown) is formed between dielectric material 513 and first conductive oxide 512a. In at least one embodiment, a second refractive intermetallic layer (not shown) is formed between ferroelectric or paraelectric dielectric material 513 and second conductive oxide 512b. In at least one embodiment, first and second refractive intermetallic layers are directly adjacent to their respective conductive oxide layers and to ferroelectric or paraelectric dielectric material 513. In at least one embodiment, refractive intermetallic maintains capacitive properties of ferroelectric or paraelectric dielectric material 513. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, or $TiAl_3$; Ni—Al such as $Ni_3Al$, $NiAl_3$, and NiAl; Ni—Ti, Ni—Ga, and $Ni_2MnGa$; FeGa or $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, or Mg can markedly enhance other properties. In at least one embodiment, thicknesses of layers of non-planar capacitor structure 500 in x-axis are in range of 1 nm to 30 nm. In at least one embodiment, refractive intermetallic layers are not used for non-planar capacitor structure 500.

Figure 5B:
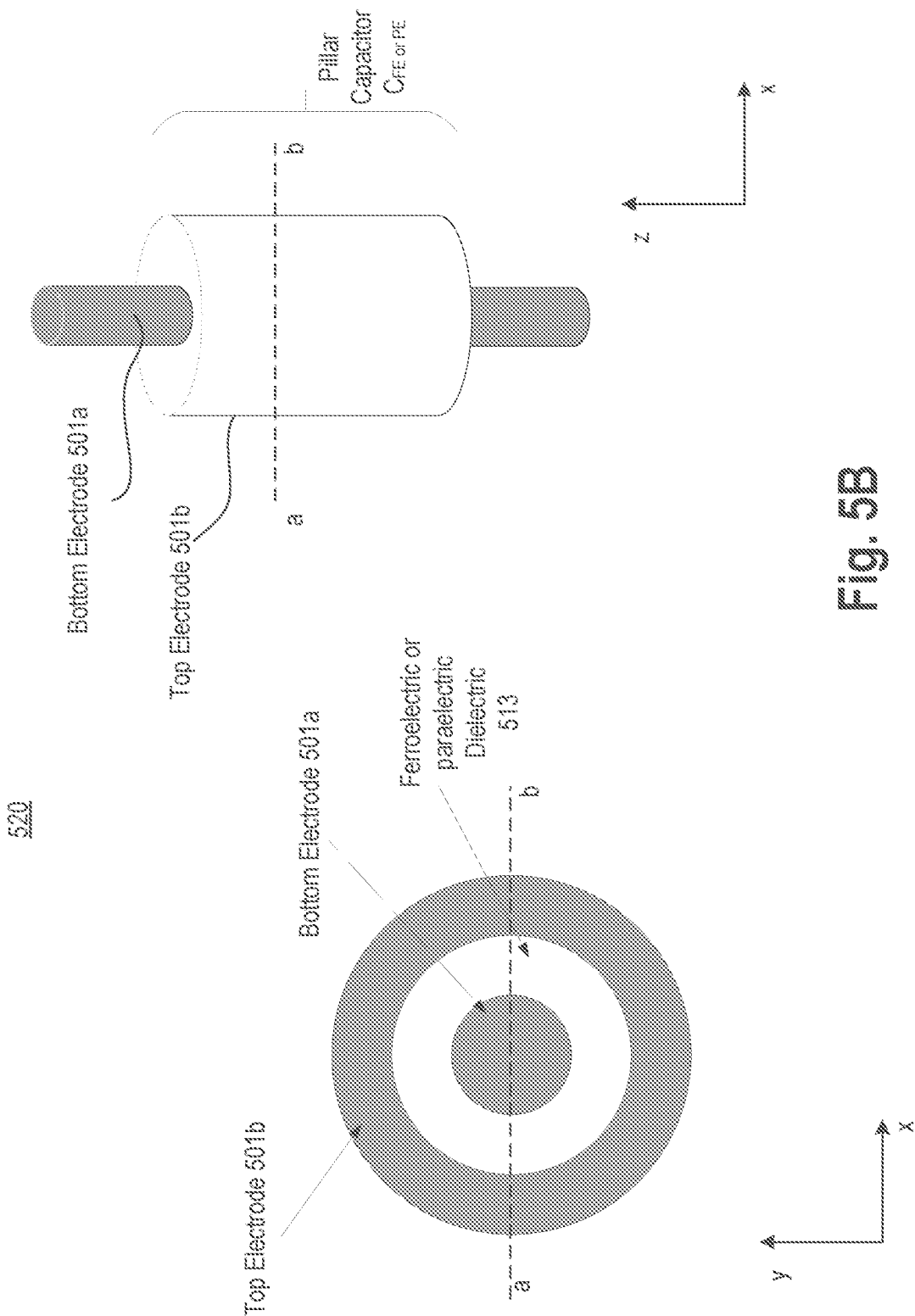
FIG. 5B illustrates a non-planar ferroelectric or a paraelectric capacitor structure without conductive oxides, in accordance with at least one embodiment.

FIG. 5B illustrates a non-planar ferroelectric or a paraelectric capacitor structure 520 without conductive oxides, in accordance with at least one embodiment. Compared to non-planar capacitor structure 500, here first conductive oxide 512a and second conductive oxide 512b are removed and ferroelectric material 513 is adjacent to top electrode 501b and bottom electrode 501a as shown, in at least one embodiment.

In at least one embodiment, ferroelectric material can be replaced with anti-ferroelectric material. In at least one embodiment, anti-ferroelectric (AFE) material includes lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (Lead Zirconate), $NH_4H2PO_4$ (Ammonium dihydrogen phosphate (ADP)), $NaNbO_3$ (Sodium Niobate), and K doped $NaNbO_3$, etc. Table 1 describes some bulk anti-ferroelectric materials, with various physical/chemical modifications for enhancing energy storage density, in at least one embodiment.

TABLE 1

| Material name | Physical/Chemical Modifications | Energy Density (J/cm³) | Electric Field (kV/cm) |
|---|---|---|---|
| (Pb0.97La0.02)(Zr0.97Ti0.03)O3 | 3 wt % glass (PbO—B2O3—SiO2—ZnO) | 3.1 | 581 |
| (Pb0.97La0.02)(Zr0.97Ti0.03)O3 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94-xLa0.04Bax)[(Zr0.60Sn0.40)0.841Ti0.16]O3 | x = 0 (0 MPa) | 0.35 | 30 |
| (Pb0.94-xLa0.04Bax)[(Zr0.60Sn0.40)0.841Ti0.16]O3 | x = 0.02 (20 MPa) | 0.38 | 30 |
| Pb0.99Nb0.02[(Zr0.60Sn0.40)0.95Ti0.05]O3 | — | 0.62 | 56 |
| Pb0.97La0.02(Zr0.56Sn0.35Ti0.09)O3 | 4 wt % glass (CdO—Bi2O3—PbO-ZnO—Al2O3—B2O3—SiO2) | 3.3 | 150 |
| Pb0.97La0.02(Zr0.56Sn0.35Ti0.09)O3 | Without glass | 1.9 | 110 |
| (Pb0:97La0:02)(Zr0:92Sn0:05Ti0:03)O3 | 3% glass (0.8PbO—0.2B2O3) | 7.4 | 475 |
| (Pb0:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03)(Zr0.74Sn0.22Ti0.04) | — | 1.2 | 100 |
| (Bi½Na½)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi½Na½TiO3-0.20Bi½K½TiO3)-0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008)(Zr0.65Sn0.3Ti0.05)O3-(Pb0.97La0.02)(Zr0.9Sn0.05Ti0.05)O3 | — | 4.65 | 200 |
| 0.89Bi0.5Na0.5TiO3-0.06BaTiO3-0.05K0.5Na0.5NbO3 | double stage sintering | 0.90 | 100 |
| (Pb0.858Ba0.1La0.02Y0.008)(Zr0.65Sn0.3Ti0.05)O3-(Pb0.97La0.02)(Zr0.9Sn0.05Ti0.05)O3 | spark plasma sintering | 6.40 | 275 |
| (Pb0.858Ba0.1La0.02Y0.008)(Zr0.65Sn0.3Ti0.05)O3-(Pb0.97La0.02)(Zr0.9Sn0.05Ti0.05)O3 | conventional sintering | 4.65 | 200 |
| (Na1 xCax)(Nb1 xZrx)O3 x = 0.04 | conventional sintering | 0.91 | 130 |

TABLE 1-continued

| Material name | Physical/Chemical Modifications | Energy Density (J/cm$^3$) | Electric Field (kV/cm) |
|---|---|---|---|
| (Pb0.92La0.04Ba0.02) [(Zr0.60Sn0.40)0.84Ti0.16]O3 | at 90 MPa | 0.91 | 60 |
| 0.91(Bi0.5Na0.5)TiO3-0.07BaTiO3-0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 6A:
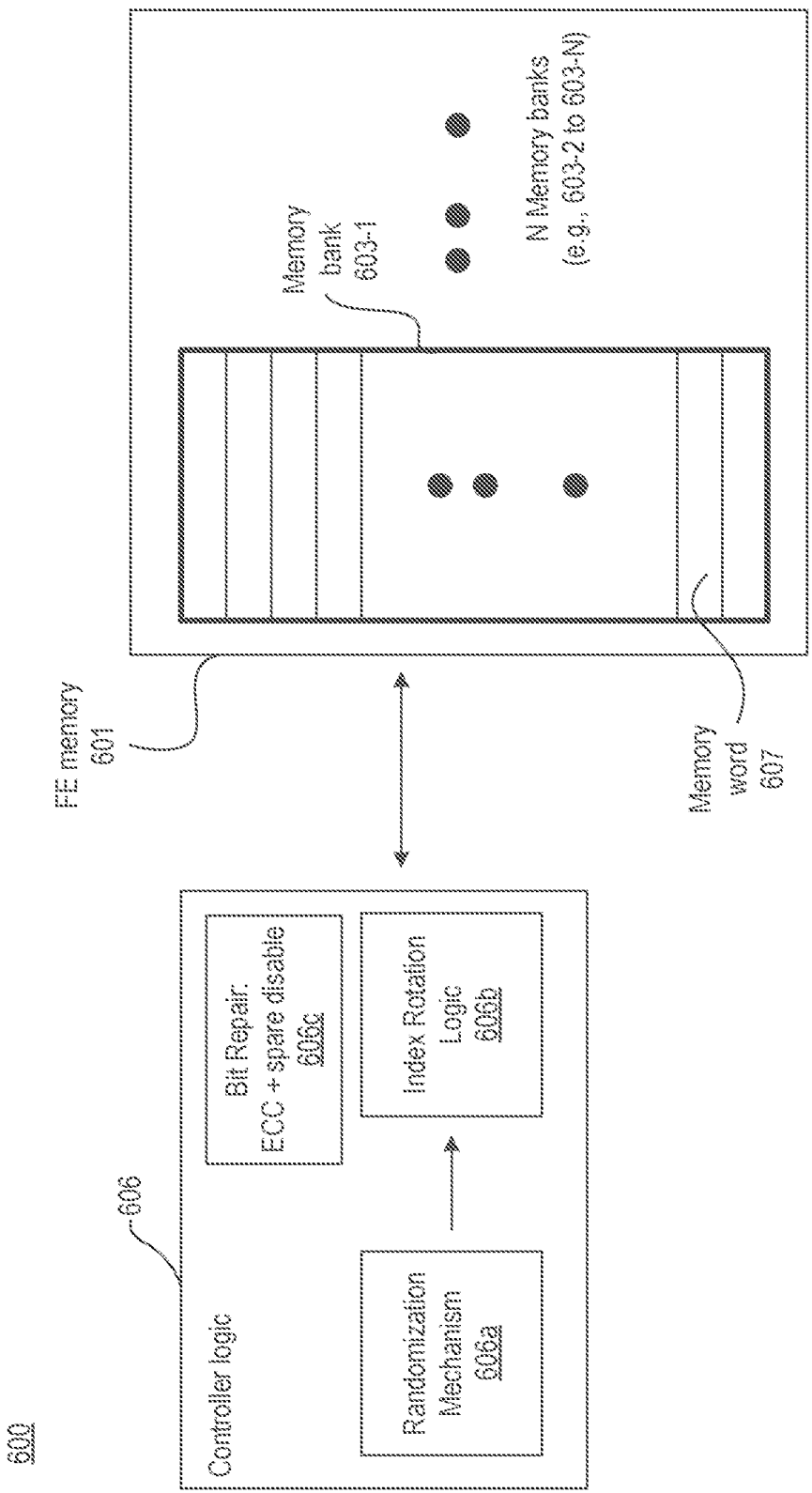
FIG. 6A illustrates a high-level endurance enhancement architecture for a paraelectric (PE) or a ferroelectric (FE) memory, in accordance with at least one embodiment.

FIG. 6A illustrates high-level endurance enhancement architecture 600 for paraelectric (PE) or ferroelectric (FE) memory, in accordance with at least one embodiment. In at least one embodiment, architecture 600 comprises memory array 601 and controller logic 606. In at least one embodiment, memory array 601 is memory with non-linear polar material. In at least one embodiment, memory array 601 includes bit-cells that comprise at least one transistor and at least one capacitor coupled to it, where capacitor has non-linear polar material.

In at least one embodiment, memory array 601 includes a plurality of memory banks (e.g., 603-1 through 603-N, where 'N' is a number). In at least one embodiment, each memory bank (e.g., 603-1) includes a plurality of memory words (e.g., memory word 607). In at least one embodiment, each memory word includes a plurality of memory bit-cells. For simplicity, other memory components are not shown such as write drivers, column multiplexers, sense-amplifiers, etc.

In at least one embodiment, controller logic 606 comprises endurance hardware and/or software to provide memory endurance to memory array 601. In at least one embodiment, memory endurance is used to ensure that write and/or read operations from memory array 601 are reliable. Write endurance is number of programs and erase cycles that become unreliable when applied to a memory block, bank, or word before memory block, bank, or word. In at least one embodiment, endurance mechanisms include a wear leveling scheme that uses index rotation, outlier compensation to handle weak bits, and random swap injection to mitigate wear out attacks. For simplicity, memory banks are generally referred to as reference 603 instead of a particular memory bank reference (e.g., 603-1, 603-2, etc.). At least one embodiment described to general reference are applicable to an individual particular reference. In at least one embodiment, description of memory bank 603 is applicable for memory banks 603-1, 603-2, through 603-N.

In at least one embodiment, controller logic 606 (also referred to as refresh logic) comprises random invertible bit matrix 606a, index rotation logic 606b, and bit repair logic 606c. In at least one embodiment, index rotation logic 606b enables random swap injection which randomizes index rotation to obfuscate mapping from addresses to rotated indexes. In at least one embodiment, index rotation logic 606b randomizes rotation of gap words in memory bank 603. Malicious users (or attackers) may write programs that deliberately track wear leveling scheme described herein. These attackers may attempt to alter a memory reference pattern to continue to stress a single physical line even as wear leveling schemes assign a physical line to different addresses. In at least one embodiment, index rotation logic 606b provides a facility to make tracking of physical lines difficult. In at least one embodiment, this facility makes a random decision (e.g., using an externally generated random number) to either swap or not swap each time a swap opportunity arises. In at least one embodiment, over time randomness injected into swapping process makes tracking cache lines more difficult.

In at least one embodiment, index rotation logic 606b is used for implementing a wear leveling scheme. In at least one embodiment, index rotation logic 606b rotates addresses throughout memory bank 603 to perform a wear leveling function. In various embodiments, index rotation logic 606b ensures that memory requests are spread across memory locations rather than a single memory location.

In at least one embodiment, bit repair logic 606c includes double error correcting, or triple error detecting error correction code (ECC) to discover new bit errors and spare disable which eliminate memory words with particularly high error rates. In at least one embodiment, spare disable involves having a buffer of spare cache lines. In at least one embodiment, when cache lines are particularly unreliable, spare disable can swap out unreliable cache lines for reliable spares. In at least one embodiment, spares may be implemented with memory technology other than FE memory such as static random-access memory (SRAM). In at least one embodiment, bit repair logic 606c addresses problem of weak memory bits. In at least one embodiment, each cache line or word 607 in memory bank 603 includes a valid bit. In at least one embodiment, valid bit indicates whether data associated with that line/word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, various endurance mechanisms discussed herein can be used in any combination or order. In at least one embodiment, some memory products may select one or more endurance mechanisms instead of all three discussed herein. In at least one embodiment, some memory products may apply all three endurance mechanisms to achieve most endurance for memory array 601. In at least one embodiment, endurance mechanisms are applied to memory array 601 to maximize usage of such memory.

Figure 6B:
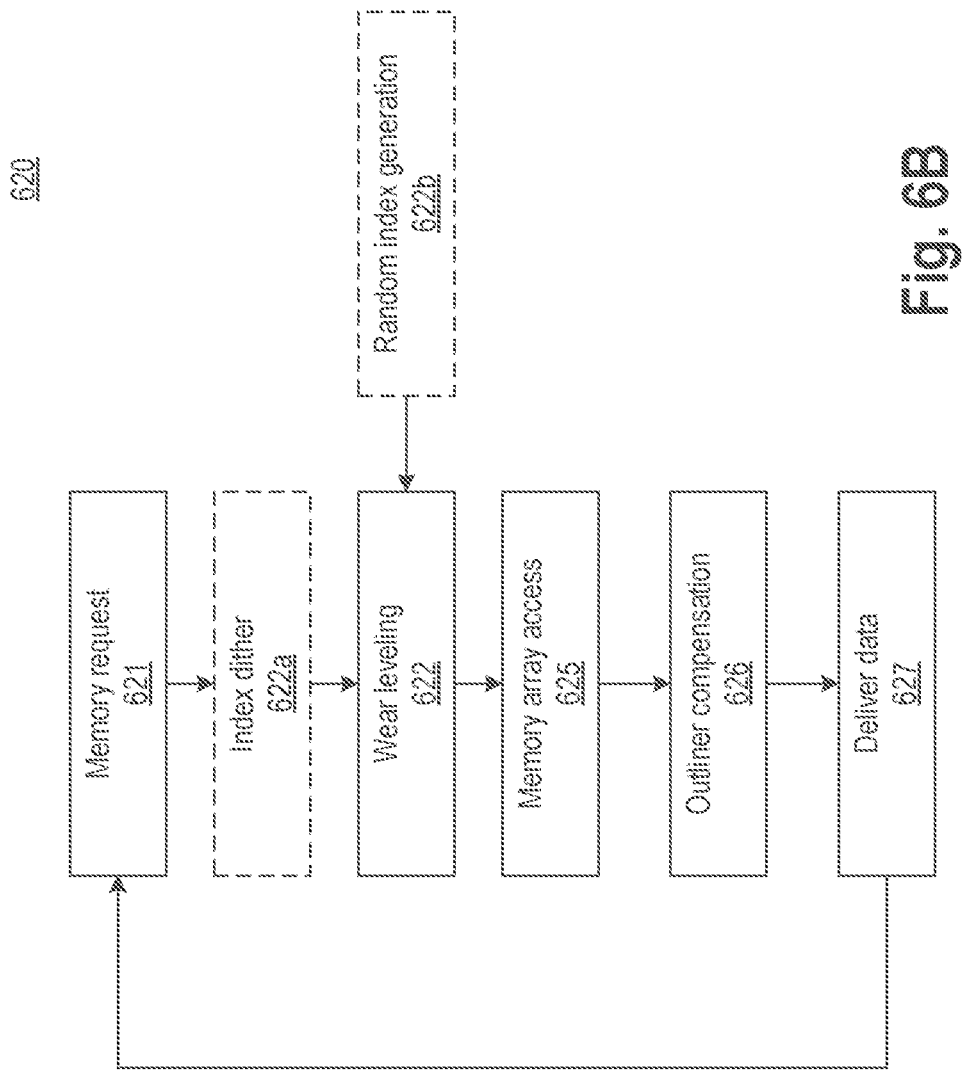
FIG. 6B illustrates a flowchart of memory endurance for PE and FE memory, in accordance with at least one embodiment.

FIG. 6B illustrates flowchart 620 of memory endurance for PE and FE memory, in accordance with at least one embodiment. While blocks in flowchart 620 are illustrated in a particular order, that order can be modified, in at least one embodiment. In at least one embodiment, some blocks may be performed before others based on whether read or write operations are being performed. In at least one embodiment, various blocks can be implemented in hardware, software, or a combination of them.

At block 621, in at least one embodiment, controller logic 606 sends a memory request to memory array 601. In at least one embodiment, this request may be a read request or a write request. In at least one embodiment, if it is a write request, controller logic 606 applies wear leveling scheme at block 622. In at least one embodiment, wear leveling scheme is linear in that a gap word or gap cache line is swapped with an adjacent word or cache line. In at least one embodiment, wear leveling is dithered as indicated by block 622a. In at least one embodiment, index or pointer to gap word or gap cache line is used to swap gap word or gap cache line with either an adjacent cell with one higher index or address or with an adjacent cell with one lower index or address. As such, in at least one embodiment, wear leveling is dithered.

In at least one embodiment, wear leveling is randomized. In at least one embodiment, a random index is generated at block 622b. In at least one embodiment, random index is then used to swap gap word or gap cache line with an adjacent or a non-adjacent word or cache line. In at least one embodiment, random index is dithered. In at least one embodiment, dithered random index is then used for wear leveling.

In at least one embodiment, if memory request is a read access (as indicated by block 625), outlier compensation is applied as indicated by block 626. At block 626, in at least one embodiment, controller logic 606 addresses problem of weak memory bits by checking a valid bit for memory word being addressed or accessed. In at least one embodiment, valid bit indicates whether data associated with that line or word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, after ECC is applied, requested data is provided to controller logic 606 as indicated by block 627. In at least one embodiment, memory endurance for non-linear polar material based memory is enhanced by endurance mechanisms. In at least one embodiment, this allows more read and write operations to memory before any memory block, bank, or word becomes unreliable. In at least one embodiment, capacitors for each bit-cell in memory array 601 are arranged in a stack and fold manner.

Figure 7:
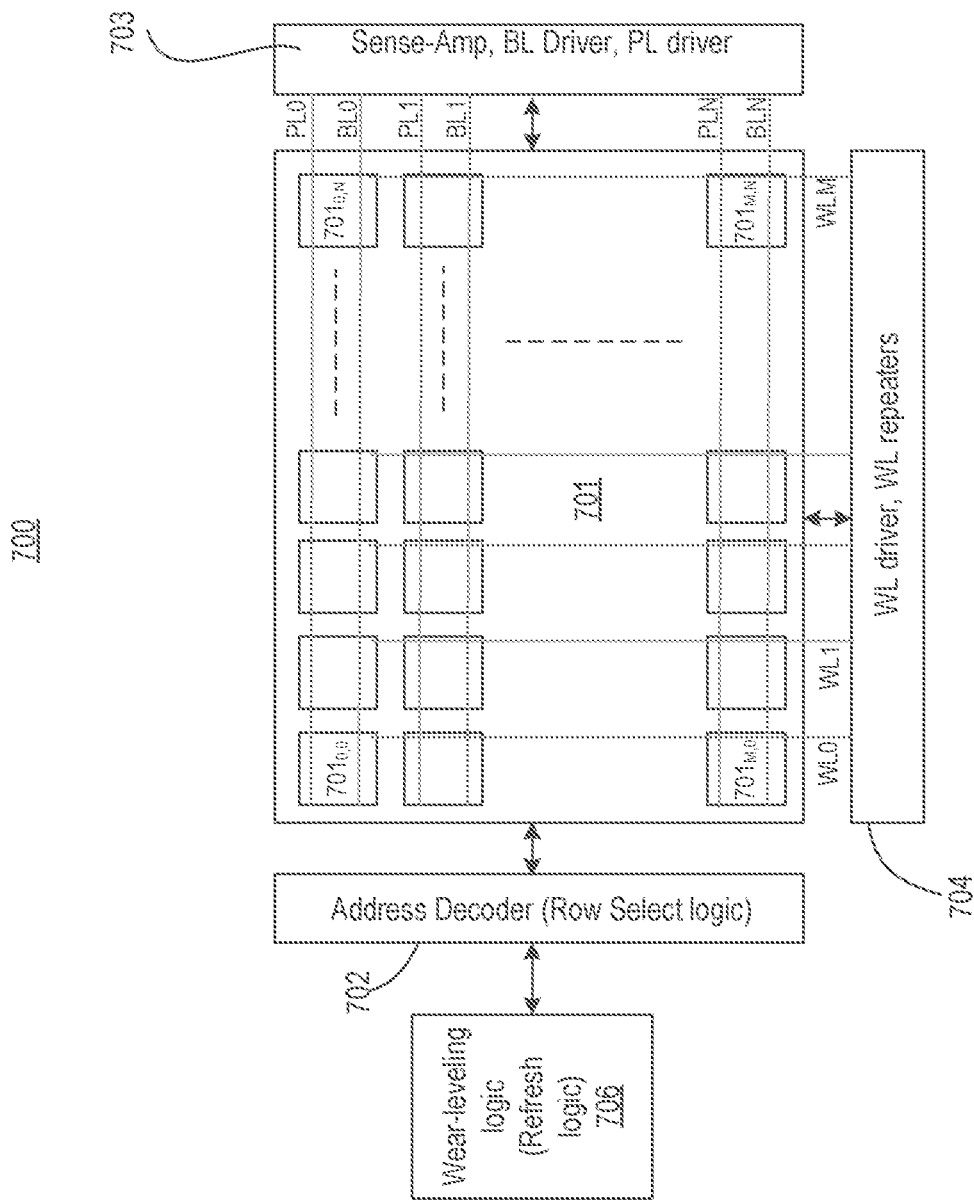
FIG. 7 illustrates an MxN memory array of bit-cells and corresponding periphery circuitry with plate-lines parallel to bit-lines, in accordance with at least one embodiment.

FIG. 7 illustrates apparatus 700 comprising an MxN memory array of bit-cells and corresponding periphery circuitry, in accordance with at least one embodiment. In at least one embodiment, apparatus 700 comprises MxN memory array 701 of bit-cells, logic circuitry 702 for address decoding, and logic circuitries 703 and 704 for sense amplifier, write drivers, and plate-line (PL) drivers. In at least one embodiment, plate-lines PL0, PL1, through PLN are parallel to bit-lines BL0, BL1 through BLN, while word-lines WL0, WL1, through WLM are orthogonal to plate-lines and bit-lines, where 'N' is a number greater than 1. In at least one embodiment, individual memory bit-cells in memory array 701 are organized in rows and columns. For example, memory bit-cells $701_{0,0}$ through $701_{M,N}$ are organized in an array. In at least one embodiment, an individual memory bit-cell (e.g., $701_{0,0}$) is a 1T1C bit-cell. An example of a 1T1C bit-cell is described with reference to FIG. 8.

Figure 8:
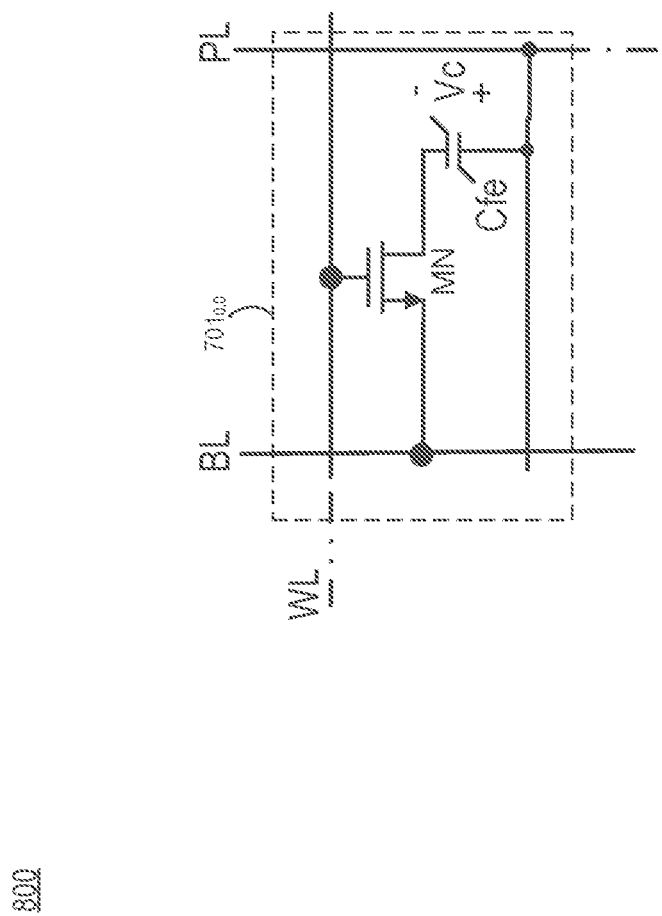
FIG. 8 illustrates 1T1C bit-cell where bit-line (BL) is parallel to plate-line (PL), in accordance with at least one embodiment.

FIG. 8 illustrates 1T1C bit-cell 800 (e.g., $701_{0,0}$) where bit-line (BL) is parallel to plate-line (PL), in accordance with at least one embodiment. In at least one embodiment, 1T1C bit-cell 800 comprises a transistor and a capacitor. In at least one embodiment, transistor is an n-type transistor MN with a gate terminal coupled or controllable by WL, a source terminal coupled to BL, and a drain terminal coupled to a first terminal of a capacitor Cfe. In at least one embodiment, a second terminal of capacitor is coupled to PL. In at least one embodiment, transistor MN is replaced with a p-type transistor. In at least one embodiment, capacitor Cfe of 1T1C bit-cell 800 is a capacitor according to any one of FIG. 2, FIG. 3A, FIG. 3B, FIGS. 4A-C, FIG. 5A, or FIG. 5B. In at least one embodiment, capacitor of 1T1C bit-cell 800 is replaced with a planar memory element structure. In at least one embodiment, planar memory element structure is a resistive element. In at least one embodiment, planar memory element structure is a magnetic tunnel junction (MTJ). In at least one embodiment, planar memory element structure is phase change memory (PCM) based element.

Figure 9:
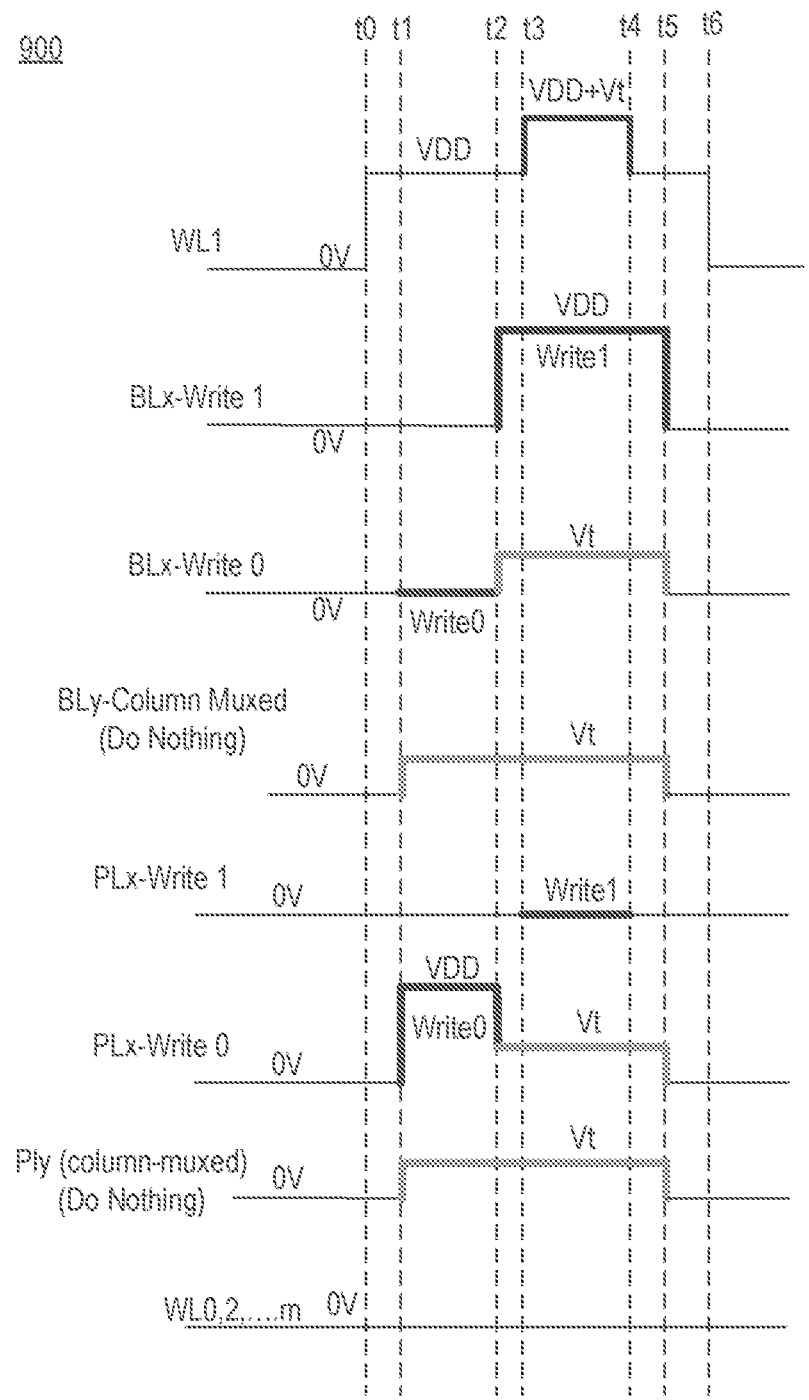
FIG. 9 illustrates a timing diagram of a write operation cycle for a 1T1C memory with BL parallel to PL, where logic 0 write operation phase is performed before logic 1 write operation phase, in accordance with at least one embodiment.

FIG. 9 illustrates timing diagram 900 of a write operation cycle for a 1T1C memory, where logic 0 write operation phase is performed before logic 1 write operation phase, in accordance with at least one embodiment. In at least one embodiment, operations or events shown in timing diagram 900 can be performed or controlled by hardware (e.g., one or more circuitries in a memory controller or logic described with reference to FIG. 7), software, or a combination of them. Software to control write operations can be provided as machine-readable instructions that when executed by one or more circuitries, write operation functions are performed.

In at least one embodiment, write logic 0 operation phase begins at time point t0 and ends at time point t2. In at least one embodiment, write logic 1 operation phase begins at time point t2 and ends at time point t5. In at least one embodiment, between time point t5 and time point t6, write operation may be in standby phase to resettle voltages. In at least one embodiment, standby phase may be eliminated and next write 0 logic operation may begin immediately after time point t5. In at least one embodiment, there may be standby time between time point t2 and time point t3 (e.g., there may be one or more cycles or time durations between write logic 0 operation and write logic 1 operation). In at least one embodiment, several signals illustrated in timing diagram 900 are digital signals in that they are either logic 1 or logic 0 levels. In at least one embodiment, some signals in timing diagram 900 are analog signals such as signals at threshold voltage level (Vt) of access transistor MN.

In at least one embodiment, in logic 0 write operation, voltage on word-line (e.g., WL1) is asserted from 0V to nominal supply voltage level (Vdd) at time point t0 to turn on access transistor MN. In at least one embodiment, to store logic 0 to capacitor Cfe, voltage on bit-line (e.g., BL1) is adjusted to 0V. In at least one embodiment, voltage on plate-line (e.g., PL1) is asserted from time point t1 to time point t2 to nominal supply voltage (e.g., Vdd). In at least one embodiment, bit-cells controlled by same word-line (e.g., WL1) that are to store logic 0 follow timing diagram 900 for write 0 operation.

In at least one embodiment, when word-line is asserted at supply voltage level (Vdd) plus Vt, during logic 1 write operation, voltage across capacitor Cfe is Vdd. In at least one embodiment, when word-line is asserted at supply voltage level (Vdd), during logic 0 write operation, voltage across capacitor Cfe is −Vdd. In at least one embodiment, when word-line is asserted at boosted supply voltage level (Vdd+Vboost), during logic 1 write operation, voltage across capacitor Cfe is Vdd. In at least one embodiment, boosted supply voltage is at least a threshold voltage of access transistor MN. In at least one embodiment, worst case operating condition (e.g., Vgs or Vds) for access transistor MN is Vdd, which presents no reliability concern.

In at least one embodiment, during first phase (e.g., t0 to t2), voltage on bit-lines for bit-cells controlled by same word-line (e.g., WL1) that are intended to be written a logic 1 value, are adjusted to 0V (e.g., see waveform of BLx-Write1). In at least one embodiment, during first phase (e.g., t0 to t2), voltage on plate-lines for bit-cells controlled by same word-line (e.g., WL1) that are intended to be written a logic 1 value, are adjusted to 0V (e.g., see waveform of PLx-Write1).

In at least one embodiment, during first phase (e.g., t0 to t2), bit-lines (e.g., BLy-Column Muxed) for bit-cells controlled by same word-line (e.g., WL1) that are column multiplexed because no new value is intended to be written to them, are adjusted to threshold voltage level Vt (e.g., threshold voltage of access transistor MN). In at least one embodiment, Vgs for access transistor MN is a difference between nominal supply voltage (Vdd) and threshold voltage Vt, and this difference ensures that access transistor MN may not violate any reliability specifications. In at least one embodiment, during first phase (e.g., t0 to t2), voltage on plate-line for column multiplexed bit-cells is adjusted to threshold voltage level Vt (e.g., see waveform PLy (column-muxed)).

In at least one embodiment, during second phase (e.g., t2 to t5), voltage on bit-lines for bit-cells controlled by same word-line (e.g., WL1) to be written logic 1 values is adjusted to nominal supply voltage Vdd. In at least one embodiment, during a portion of second phase (e.g., between t3 and t4), voltage on word-line (e.g., WL1) is adjusted to boosted supply level (e.g., Vdd plus Vt) so that Vdd is passed on to capacitor Cfe. In at least one embodiment, boosted supply level is provided by a separate supply line. In at least one embodiment, boosted supply level may be internally generated on-die (e.g., using a voltage regulator, low-dropout regulator, etc.). In at least one embodiment, boosted supply level may be provided to a die from an off-die power supply source (e.g., an external power supply). In at least one embodiment, boosted supply level has an adjustable level. In at least one embodiment, voltage level of boosted supply level can be adjusted by software, hardware, or a combination of them. In at least one embodiment, Vdd can be a maximum operational voltage for a transistor for a process technology node. In at least one embodiment, Vgs of access transistor MN is Vt which ensures that access transistor MN satisfies reliability specifications while providing Vdd to capacitor Cfe.

In at least one embodiment, during second phase (e.g., t2 to t5), voltage on bit-lines for bit-cells controlled by same word-line (e.g., WL1) that are intended to be written a logic 0 value, are adjusted to threshold voltage Vt (e.g., see waveform of BLx-Write 0). In at least one embodiment, during second phase (e.g., t2 to t5), voltage on plate-lines for bit-cells controlled by same word-line (e.g., WL1) that are intended to be written a logic 0 value, are adjusted to threshold voltage (e.g., see waveform of PLx-Write0).

In at least one embodiment, during second phase (e.g., t2 to t5), voltage on bit-lines (e.g., BLy-Column Muxed) for bit-cells controlled by same word-line (e.g., WL1) that are column multiplexed because no new value is intended to be written to them, are adjusted to threshold voltage level Vt (e.g., threshold voltage of access transistor MN). In at least one embodiment, during second phase (e.g., t2 to t5), voltage on plate-line for column multiplexed bit-cells is adjusted to threshold voltage level Vt (e.g., see waveform PLy (column-muxed)).

In at least one embodiment, to avoid possible race conditions, voltage on word-line (e.g., WL1) is reduced back to Vdd from its elevated or boosted level before bit-line or plate-line voltages are adjusted back to 0V. In at least one embodiment, unselected word-lines (e.g., WL0, WL2 through WLm) are set to 0V to deactivate access transistors associated with those word-lines.

In at least one embodiment, timing diagram 900 can be flipped such that activities of first phase are performed after activities of second phase. In at least one embodiment, logic 1 write operations are performed prior to logic 0 write operations. In at least one embodiment, access transistor MN is replaced with a p-type transistor. In at least one embodiment, with p-type access transistor, polarities of control signals (e.g., word-line) are reversed from those shown in timing diagram 900 for correct logic operation. In at least one embodiment, access transistor in a first memory bank may be an n-type transistor MN. In at least one embodiment, access transistor in a second memory bank of a memory may be a p-type transistor. In at least one embodiment, having a mix of bit-cells with different conductivity-type for their access transistors (e.g., n-type or p-type) per memory bank may address maximum density issues related to memory. In at least one embodiment, timing diagram 900 can be converted into a method flowchart (not shown) to illustrate sequence of waveforms and their relationships.

Figure 10:
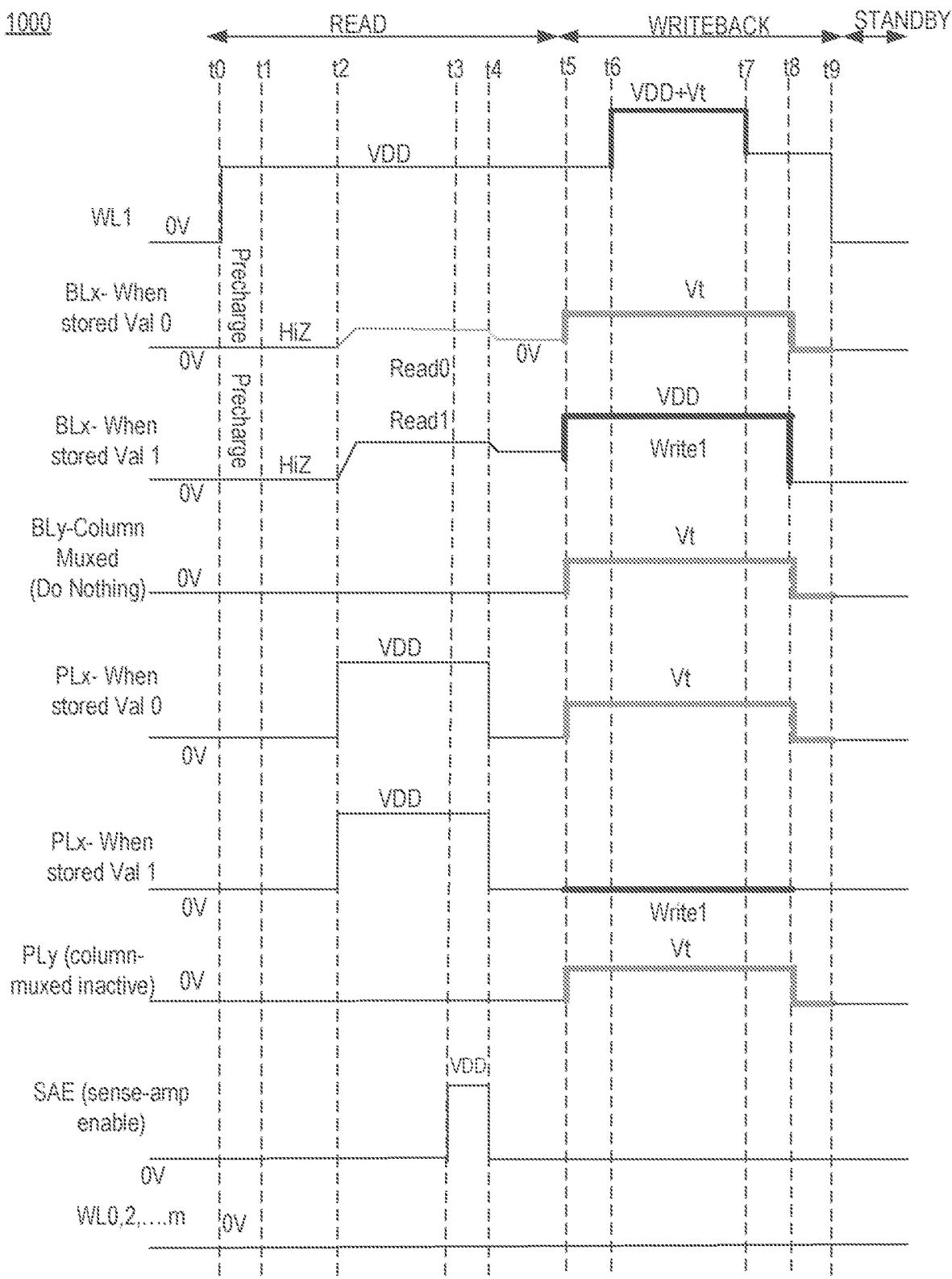
FIG. 10 illustrates a timing diagram of a read operation cycle for a 1T1C memory with BL parallel to PL, where a read phase is performed before a writeback phase, in accordance with at least one embodiment.

FIG. 10 illustrates timing diagram 1000 of a read operation cycle for a 1T1C memory, where a read phase is performed before a writeback phase, in accordance with at least one embodiment. In at least one embodiment, read operation comprises a read phase, a writeback phase, and a standby phase. In at least one embodiment, writeback phase follows read phase. In at least one embodiment, standby phase follows writeback phase. Here, read phase extends from tine point t0 to t5, writeback base extends from time point t5 to t9, and standby phase extends from time point t9 onwards. In at least one embodiment, operations or events shown in timing diagram 1000 can be performed or controlled by hardware (e.g., one or more circuitries in a memory controller or logic described with reference to FIG. 7), software, or a combination of them. In at least one embodiment, several signals illustrated in timing diagram 1000 are digital signals in that they are either logic 1 or logic 0 levels. In at least one embodiment, some signals in timing diagram 1000 are analog signals such as signals at threshold voltage level (Vt) of access transistor MN and when bit-line voltage when bit-line is floated.

In at least one embodiment, read phase begins by asserting voltage on selected WL (e.g., WL1) to a nominal supply voltage level (e.g., Vdd). In at least one embodiment, a writeback scheme is implemented after read phase to restore data value stored in selected bit-cell. In at least one embodiment, writeback scheme is performed to mitigate destructive nature of read operation. In at least one embodiment, data which is read is also written back in writeback time window after read time window. In at least one embodiment, writeback scheme may not follow a read phase or operation immediately. In at least one embodiment, there may be one or more idle cycles between a read phase and a writeback operation. In at least one embodiment, there may be no writeback operation after read operation (e.g., when a write operation is expected to happen after read phase, or when read phase is not destructive or destructive enough to use a writeback operation).

In at least one embodiment, voltage on a selected PL (e.g., PLx) is asserted for capacitor of bit-cell which is being read (e.g., capacitor Cfe). In at least one embodiment, voltage on PL is asserted for a time period long enough for a sense amplifier to sense value stored on storage node coupled to capacitor. In at least one embodiment, sense amplifier enable signal (SAE) is asserted (e.g., to Vdd) within a pulse width of selected PL (e.g., PLx). In at least one embodiment, to read data from storage node, voltage on BL is first set or forced to zero volts (e.g., a precharged state) and then BL is allowed to float (e.g., BLx driver goes into high impedance state Z (HiZ)). In at least one embodiment, BL is precharged to a certain voltage or a programmable voltage. In at least one embodiment, when WL is selected, in conjunction with PL voltage, a field is created across capacitor Cfe.

In at least one embodiment, after BL driver is configured in a high impedance state, selected BL is floated, which allows sense amplifier to sense voltage on storage node via BL. In at least one embodiment, sense amplifier is configured to sense voltage on BL by comparing it to one or more thresholds. In at least one embodiment, when BLx charges to a first voltage level, a logic 0 is read (Read 0). In at least one embodiment, when BLx charges to a second voltage level (higher than first voltage level), a logic 1 is read (Read 1). In at least one embodiment, after sense amplifier is disabled (SAE is set to 0), voltage on selected BL is forced to zero volts. In at least one embodiment, after selected BL is forced to 0V, writeback process begins. In at least one embodiment, writeback process may not be needed if read operation is not a destructive read.

In at least one embodiment, selected bit-line (e.g., BLx) is set to 0V, and depending on whether a logic 1 or a logic 0 value is written during writeback to selected capacitor Cfe (via plate-line PLx), selected bit-line is toggled. In at least one embodiment, writeback scheme is same as write operation of FIG. 9. In at least one embodiment, writeback scheme is second phase (e.g., t2 through t5) of write operation of FIG. 9, which comprises logic 1 write operation (e.g., write 1 operation). In at least one embodiment, logic 0 write operation of first phase (e.g., t0 through t2) of write operation of FIG. 9 is effectively performed during read phase of FIG. 10 and be skipped during read operation of FIG. 10.

In at least one embodiment, in writeback process, BL is charged to Vdd or set to 0V depending upon whether a logic 1 or a logic 0 is written back to selected bit-cell. In at least one embodiment, value written back to bit-cell is same value that sense amplifier detects when reading voltage on BL. In at least one embodiment, WL for unselected bit-cells is set to 0V (e.g., WL0, . . . WLm is set to 0 when WL1 is selected). In at least one embodiment, BL and PLs for unselected bit-cells may also be set to 0V. BLy-Column Muxed for bit-cells controlled by same word-line (e.g., WL1) that are column multiplexed because no new value is intended to be written to them, are adjusted to threshold voltage level Vt (e.g., threshold voltage of access transistor MN) in writeback process (e.g., between t5 and t8). In at least one embodiment, PLy-Column Muxed for bit-cells, like BLx-Column Muxed, are adjusted to threshold voltage level Vt (e.g., threshold voltage of access transistor MN) in writeback process (e.g., between t5 and t8). In at least one embodiment, wear-leveling logic 706 is used for memory endurance.

Figure 11:
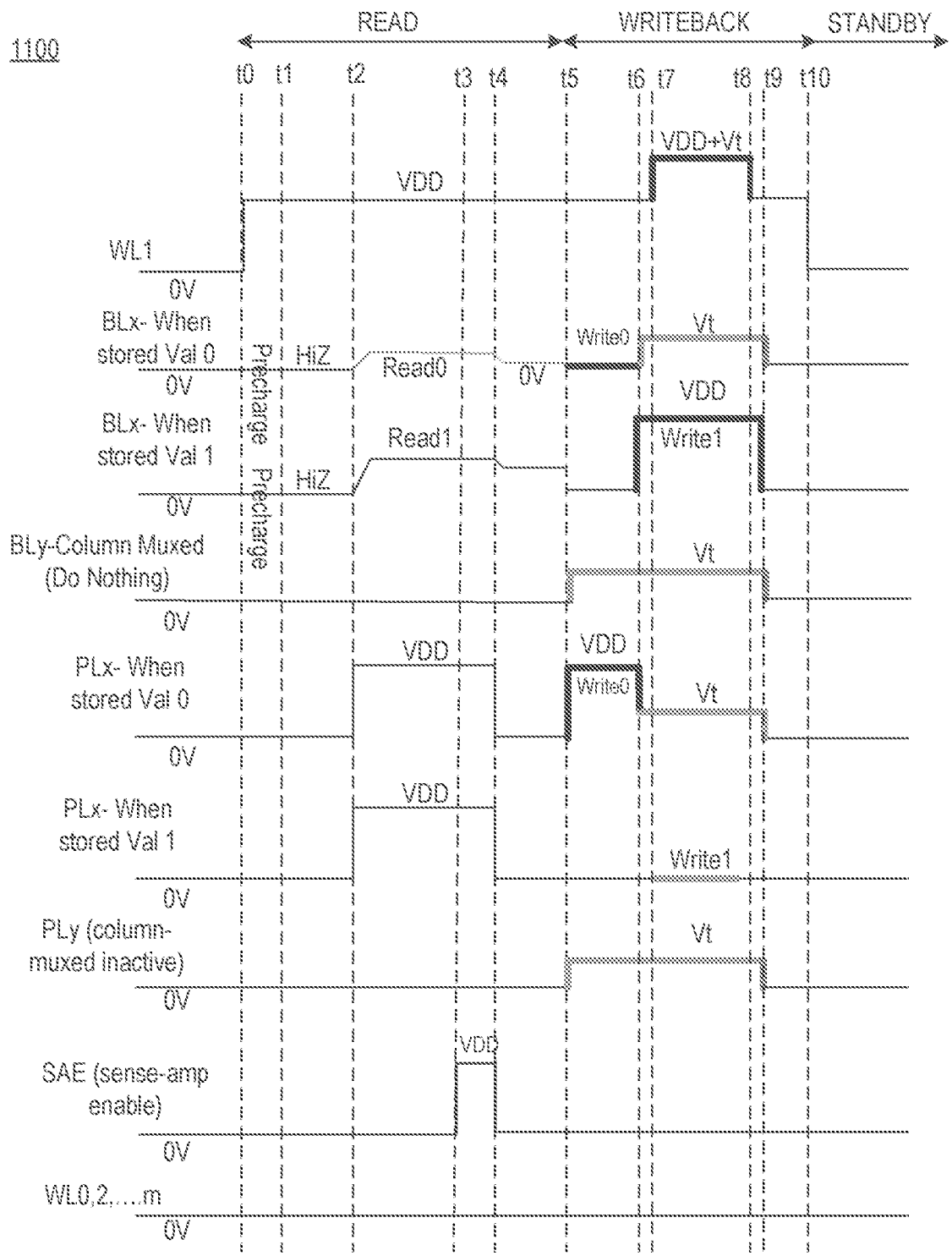
FIG. 11 illustrates a timing diagram of a read operation cycle for a 1T1C memory with BL parallel to PL, where a read phase is performed before a writeback phase and where writeback phase can write a logic 0 or a logic 1, in accordance with at least one embodiment.

FIG. 11 illustrates timing diagram 1100 of a read operation cycle for a 1T1C memory with BL parallel to PL, where a read phase is performed before a writeback phase and where writeback phase can write a logic 0 or a logic 1, in accordance with at least one embodiment. Timing diagram 1100 is similar to timing diagram 1000 but with writeback phase that can write logic 0 or logic 1 depending on logic value read from bit-cell during read phase. In at least one embodiment, writeback phase is write operation of FIG. 9, which is illustrated in timing diagram 1100.

Figure 12:
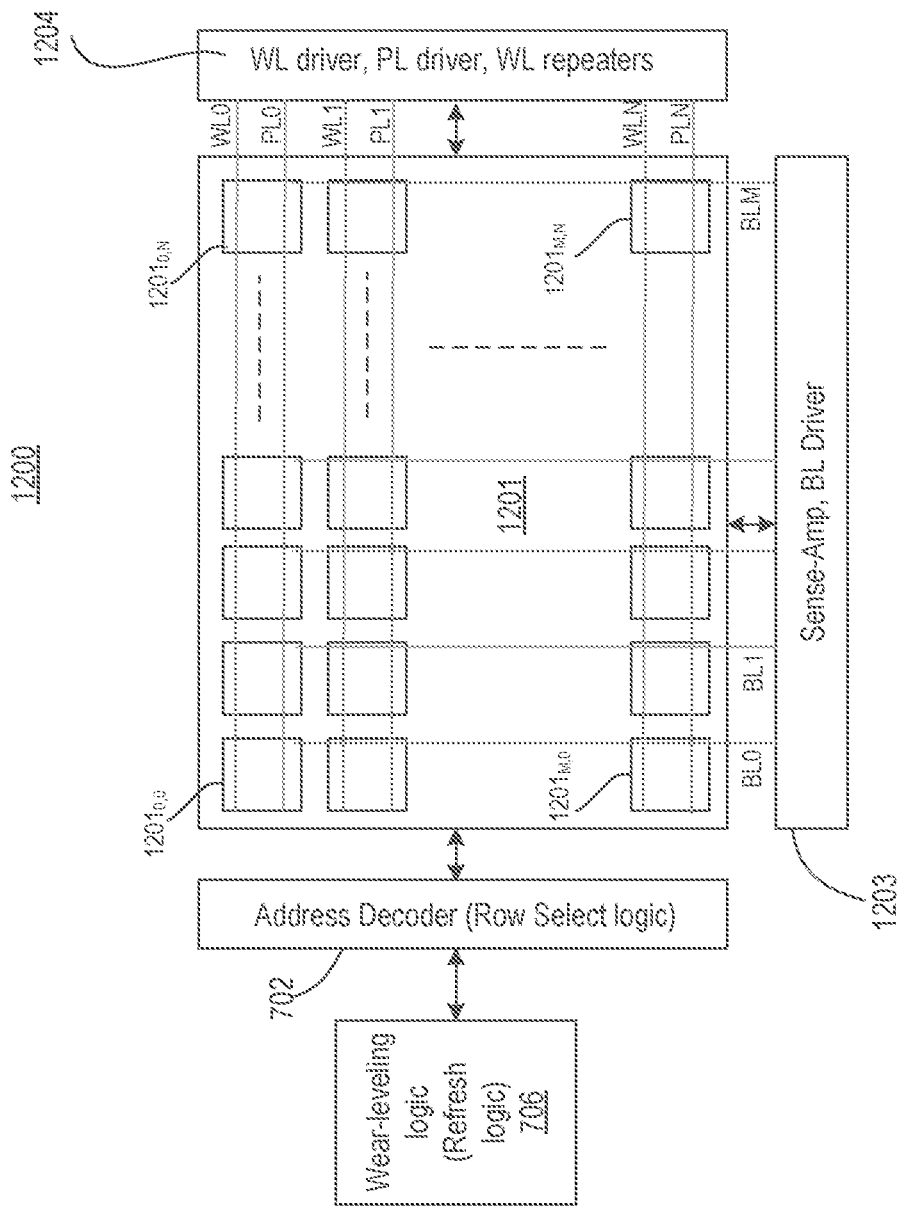
FIG. 12 illustrates an MxN memory array of bit-cells and corresponding periphery circuitry with plate-lines parallel to word-lines, in accordance with at least one embodiment.

FIG. 12 illustrates an MxN memory array of bit-cells and corresponding periphery circuitry with plate-lines parallel to word-lines, in accordance with at least one embodiment. In at least one embodiment, apparatus 1200 comprises MxN memory array 1201 of bit-cells, logic circuitry 702 for address decoding, and logic circuitries 1203 and 1204 for sense amplifier, write drivers, and plate-line (PL) drivers. In at least one embodiment, plate-lines PL0, PL1, through PLN are parallel to word-lines WL0, WL1, through WLM while bit-lines BL0, BL1 through BLN are orthogonal to plate-lines and word-lines, where 'N' is a number greater than 1. In at least one embodiment, individual memory bit-cells in memory array 1201 are organized in rows and columns. For example, memory bit-cells $1201_{0,0}$ through $1201_{M,N}$ are organized in an array. In at least one embodiment, an individual memory bit-cell (e.g., $1201_{0,0}$) is a 1T1C bit-cell. An example of a 1T1C bit-cell is described with reference to FIG. 13.

Figure 13:
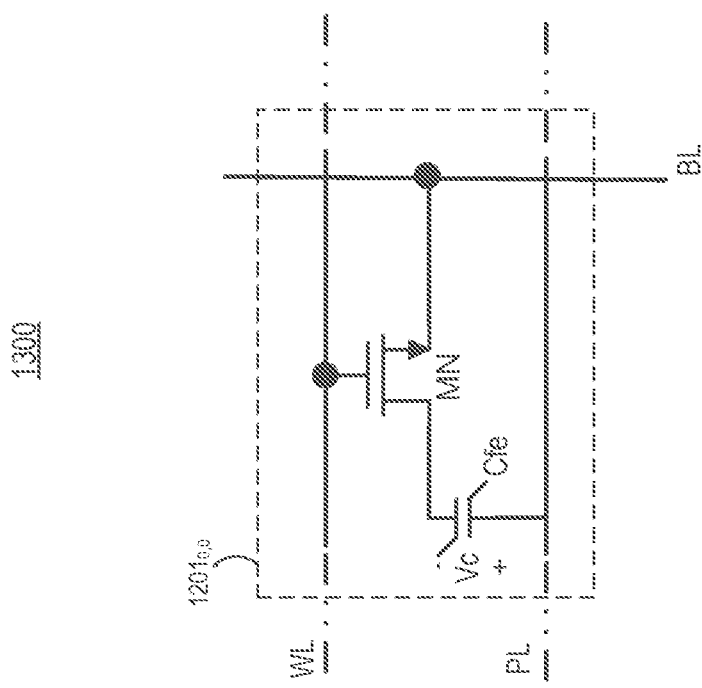
FIG. 13 illustrates 1T1C bit-cell where word-line (WL) is parallel to plate-line (PL), in accordance with at least one embodiment.

FIG. 13 illustrates 1T1C bit-cell where word-line (WL) is parallel to plate-line (PL), in accordance with at least one embodiment. In at least one embodiment, 1T1C bit-cell 1300 (e.g., $1201_{0,0}$) comprises a transistor and a capacitor. In at least one embodiment, transistor is an n-type transistor with a gate terminal coupled or controllable by WL, a source terminal coupled to BL, and a drain terminal coupled to a first terminal of a capacitor. In at least one embodiment, a second terminal of capacitor is coupled to PL. In at least one embodiment, transistor is a p-type transistor. In at least one embodiment, capacitor of 1T1C bit-cell 1300 is a capacitor according to any one of FIG. 2, FIG. 3A, FIG. 3B, FIGS. 4A-C, FIG. 5A, or FIG. 5B. In at least one embodiment, capacitor of 1T1C bit-cell 1300 is replaced with a planar memory element structure. In at least one embodiment, planar memory element structure is a resistive element. In at least one embodiment, planar memory element structure is a magnetic tunnel junction (MTJ). In at least one embodiment, planar memory element structure is phase change memory (PCM) based element.

Figure 14A:
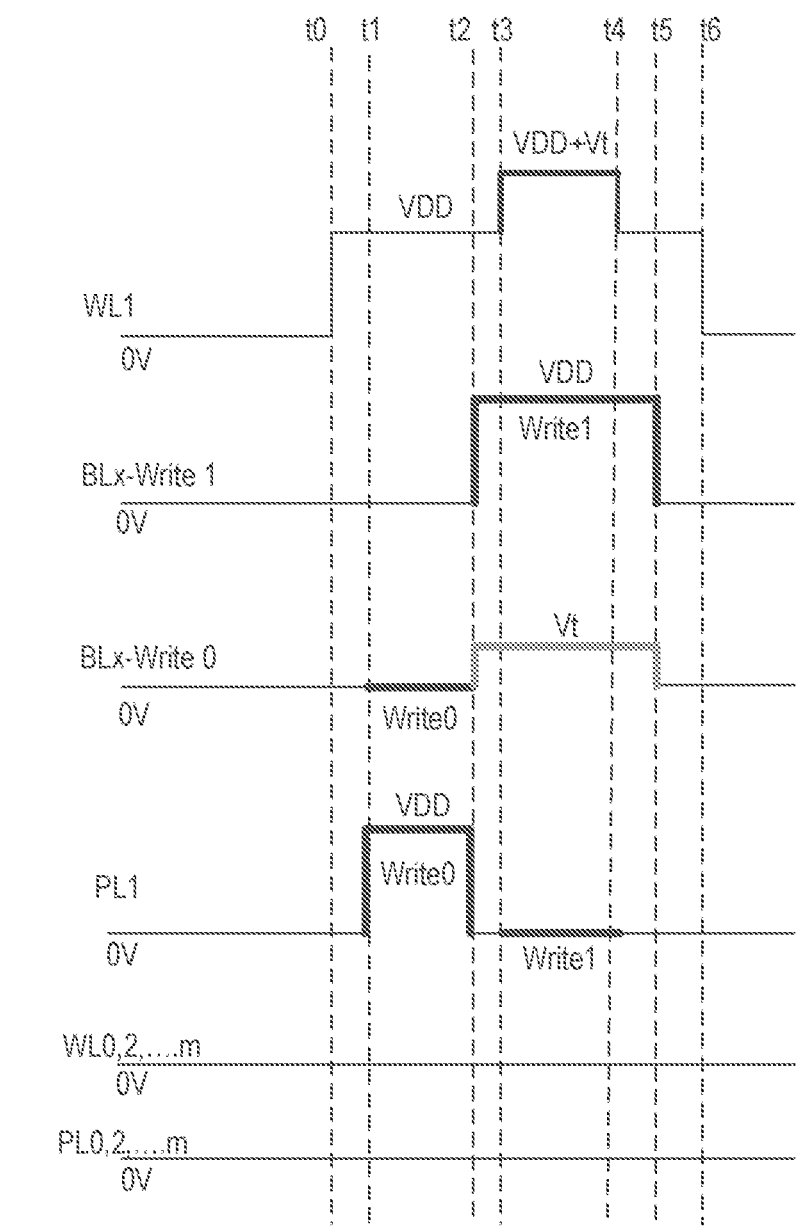
FIGS. 14A-B illustrate timing diagrams of a write operation cycle for a 1T1C memory with WL parallel to PL, where logic 0 write operation phase is performed before logic 1 write operation phase, in accordance with at least one embodiment.

FIG. 14A illustrates timing diagram 1400 of a write operation cycle for a 1T1C memory with WL parallel to PL, where logic 0 write operation phase is performed before logic 1 write operation phase, in accordance with at least one embodiment. In at least one embodiment, operations or events shown in timing diagram 1400 can be performed or controlled by hardware (e.g., one or more circuitries in a memory controller or logic described with reference to FIG. 12), software, or a combination of them. Software to control write operations can be provided as machine-readable instructions that when executed by one or more circuitries, cause write operations to be performed.

In at least one embodiment, write logic 0 operation phase begins at time point t1 and ends at time point t2. In at least one embodiment, write logic 1 operation phase begins at time point t2 and ends at time point t5. In at least one embodiment, between time point t5 and time point t6, write operation may be in standby phase to resettle voltages on bit-lines and/or plate-lines. In at least one embodiment, standby phase may be eliminated and next write 0 logic operation may begin immediately after time point t5. In at least one embodiment, there may be standby time between time point t2 and time point t3 (e.g., there may be one or more cycles or time durations between write logic 0 operation and write logic 1 operation). In at least one embodiment, several signals illustrated in timing diagram 1400 are digital signals in that they are either logic 1 or logic 0 levels. In at least one embodiment, some signals in timing diagram 1400 are analog signals such as signals at threshold voltage level (Vt) of access transistor MN.

In at least one embodiment, in logic 0 write operation, voltage on word-line (e.g., WL1) is asserted from 0V to nominal supply voltage level (Vdd) to turn on access transistor MN. In at least one embodiment, WL is asserted to Vdd level at time point t0 prior to setting bit-lines to voltages for writing logic 0 or logic 1.

In at least one embodiment, to store logic 0 to capacitor Cfe, voltage on bit-line (e.g., BL1) is adjusted to 0V (see, BLx-Write 0). In at least one embodiment, voltage on plate-line (e.g., PL1) is asserted from time point t1 to time point t2 to nominal supply voltage (e.g., Vdd). In at least one embodiment, after t2, voltage on selected plate-line (e.g., PL1) is set to 0V for write 0 logic operation. In at least one embodiment, bit-cells controlled by same word-line (e.g., WL1) that are to store logic 0 follow timing diagram 1400 for write 0 operation.

In at least one embodiment, unselected word-lines (e.g., WL0, WL2, . . . WLM) are set to 0V during write logic 0 and write logic 1 operations. In at least one embodiment, unselected plate-lines (e.g., PL0, PL2, through PLM) are set to 0V during write logic 0 and write logic 1 operations.

In at least one embodiment, to store logic 0 to capacitor Cfe, voltage on bit-line (e.g., BL1) is adjusted to Vdd (see, BLx-Write 1) between time point t2 and time point t5. In at least one embodiment, when word-line (e.g., WL1) is asserted at supply voltage level (Vdd) plus Vt, during logic 1 write operation, voltage across capacitor Cfe is Vdd. In at least one embodiment, when word-line is asserted at supply voltage level (Vdd), during logic 0 write operation, voltage across capacitor Cfe is −Vdd. In at least one embodiment, when word-line is asserted at boosted supply voltage level (Vdd+Vboost), during logic 1 write operation, voltage across capacitor Cfe is Vdd. In at least one embodiment, worst case operating condition (e.g., Vgs or Vds) for access transistor MN is Vdd, which presents no reliability concern. In at least one embodiment, Vboost is at least a threshold voltage Vt of access transistor MN.

In at least one embodiment, during first phase (e.g., t0 to t2), voltage on bit-lines for bit-cells controlled by same word-line (e.g., WL1) that are intended to be written a logic 1 value, are adjusted to 0V (e.g., see waveform of BLx-Write1).

In at least one embodiment, during second phase (e.g., t2 to t5), voltage on bit-lines for bit-cells controlled by same word-line (e.g., WL1) to be written logic 1 values is adjusted to nominal supply voltage Vdd. In at least one embodiment, during a portion of second phase (e.g., between t3 and t4), voltage on word-line (e.g., WL1) is adjusted to boosted supply level (e.g., Vdd plus Vt) so that Vdd is passed on to capacitor Cfe. In at least one embodiment, boosted supply level is provided by a separate supply line. In at least one embodiment, boosted supply level may be internally generated on-die (e.g., using a voltage regulator, low-dropout regulator, flying capacitor topology, etc.) dynamically or statically. In at least one embodiment, boosted supply level may be provided to a die from an off-die power supply source (e.g., an external power supply). In at least one embodiment, boosted supply level has an adjustable level. In at least one embodiment, voltage level of boosted supply level can be adjusted by software, hardware, or a combination of them. In at least one embodiment, Vdd can be a maximum operational voltage for a transistor for a process technology node. In at least one embodiment, Vgs of access transistor MN is Vt which ensures that access transistor MN satisfies reliability specifications while providing Vdd to capacitor Cfe.

In at least one embodiment, during second phase (e.g., t2 to t5) when write 1 logic is being written to selected bit-cell, voltage on bit-lines for bit-cells controlled by same word-line (e.g., WL1) that are intended to be written a logic 0 value, are adjusted to threshold voltage Vt (e.g., see waveform of BLx-Write 0). Adjusting voltage to threshold voltage is referred to as Vt parking. In at least one embodiment, Vt parking of those bit cells ensures that as WL voltage is boosted-up, access transistor MN does not see any reliability concerns around it. In at least one case, given that voltage on PL is still at 0V, these freshly written cells may see a disturbed field of opposite polarity of same strength as Vt. In one example, since there is no column multiplexing, this disturb field applied on bit cell may not be time-accumulative and is applied to these bit-cells one time. In at least one embodiment, threshold Vt voltage is much lower than $V_c$ to minimize impact of disturb on these freshly written bit cells during this phase. In at least one embodiment, since disturb field impact below $V_c$ goes down exponentially, there may be a trade-off between transistor reliability and loss of dp due to disturb on bit cells that were written a logic 0 in an earlier phase.

In at least one embodiment, to avoid possible race conditions, voltage on word-line (e.g., WL1) is reduced back to Vdd (e.g., between t4 and t6) from its elevated or boosted level before bit-line is adjusted back to 0V. In at least one embodiment, unselected word-lines (e.g., WL0, WL2, through WLm) are set to 0V to deactivate access transistors associated with those word-lines.

In at least one embodiment, timing diagram 1400 can be flipped if bit-line for those to be written a logic 1 is parked at VDD between time points t0 and t1 or t2, such that activities of first phase are performed after activities of second phase. In at least one embodiment, logic 1 write operations are performed prior to logic 0 write operations. In at least one embodiment, n-type access transistor MN is replaced with a p-type transistor. In at least one embodiment, with p-type access transistor, polarities of control signals (e.g., word-line) are reversed from those shown in timing diagram 1400 for correct logic operation. In at least one embodiment, access transistor in a first memory bank may be an n-type transistor MN. In at least one embodiment, access transistor in a second memory bank of a memory may be a p-type transistor. In at least one embodiment, having a mix of bit-cells with different conductivity-type for their access transistors (e.g., n-type or p-type) per memory bank may address maximum density issues related to memory. In at least one embodiment, timing diagram 1400 can be converted into a method flowchart (not shown) to illustrate sequence of waveforms and their relationships.

Figure 14B:
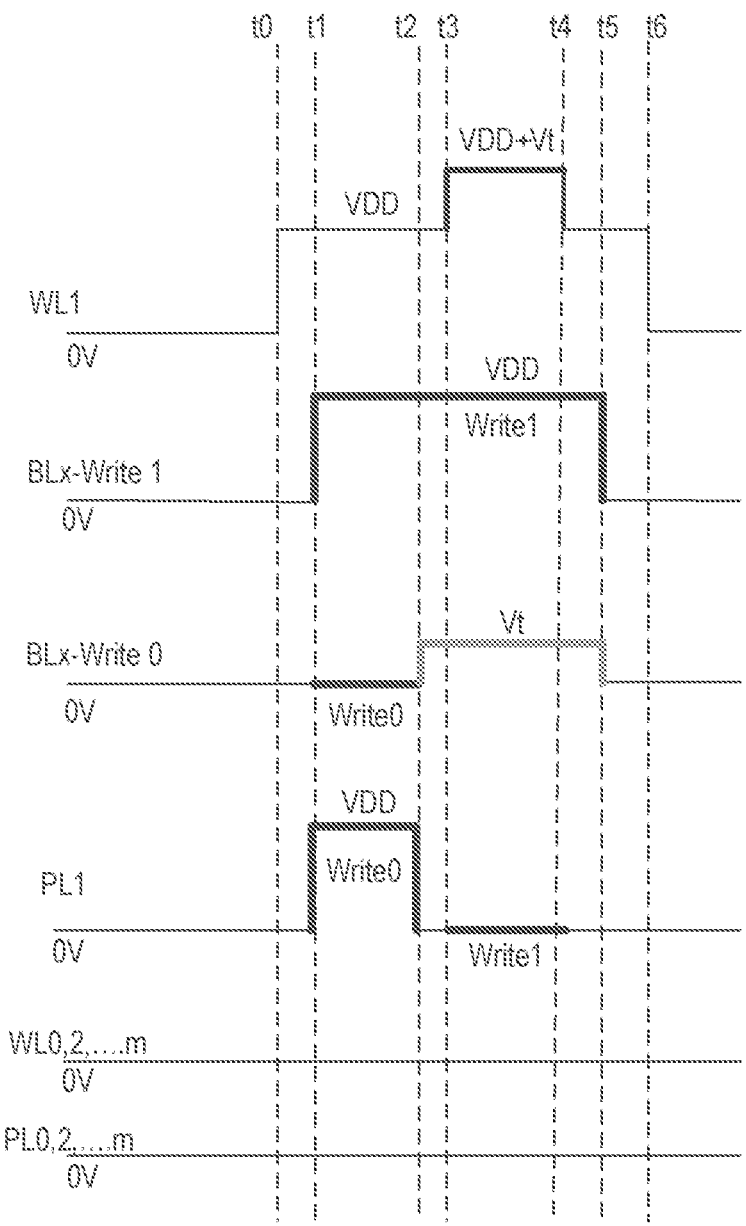

FIG. 14B illustrates timing diagram 1420 of a write operation cycle for a 1T1C memory with WL parallel to PL, where logic 0 write operation phase is performed before logic 1 write operation phase, in accordance with at least one embodiment. Compared to FIG. 14A, here, BLx_Write1 is set to VDD between t1 and t5. In at least one embodiment, when plate-line (PL) is parallel to word-line (WL), PL toggles high (e.g., VDD) between time points t1 to t2 to apply the field across capacitor to facilitate write operation. In one such example, bit-cells that are to be written a logic 1, in first phase get written a logic 0, before those bit-cells are written a logic 1 in subsequent phase t2 to t5. In at least one embodiment, to prevent unnecessary switching of voltage or charge on capacitors that are to be written a logic 1, voltage on bit-lines for those bit cells (e.g., BLx_Write1) can instead be parked at VDD during time points t0 to t2 or t1 to t2. By parking the voltage on bit-lines to Vdd ensures that those capacitors of those bit-cells may not see any effective field across them during t1 to t2 phase, which would have otherwise made voltages on these capacitors to switch to logic 0, before subsequent logic 1 write phase (t2 to t5). As such, unnecessary switching of voltages or charge on capacitors can be prevented, in accordance with at least one embodiment.

Figure 15:
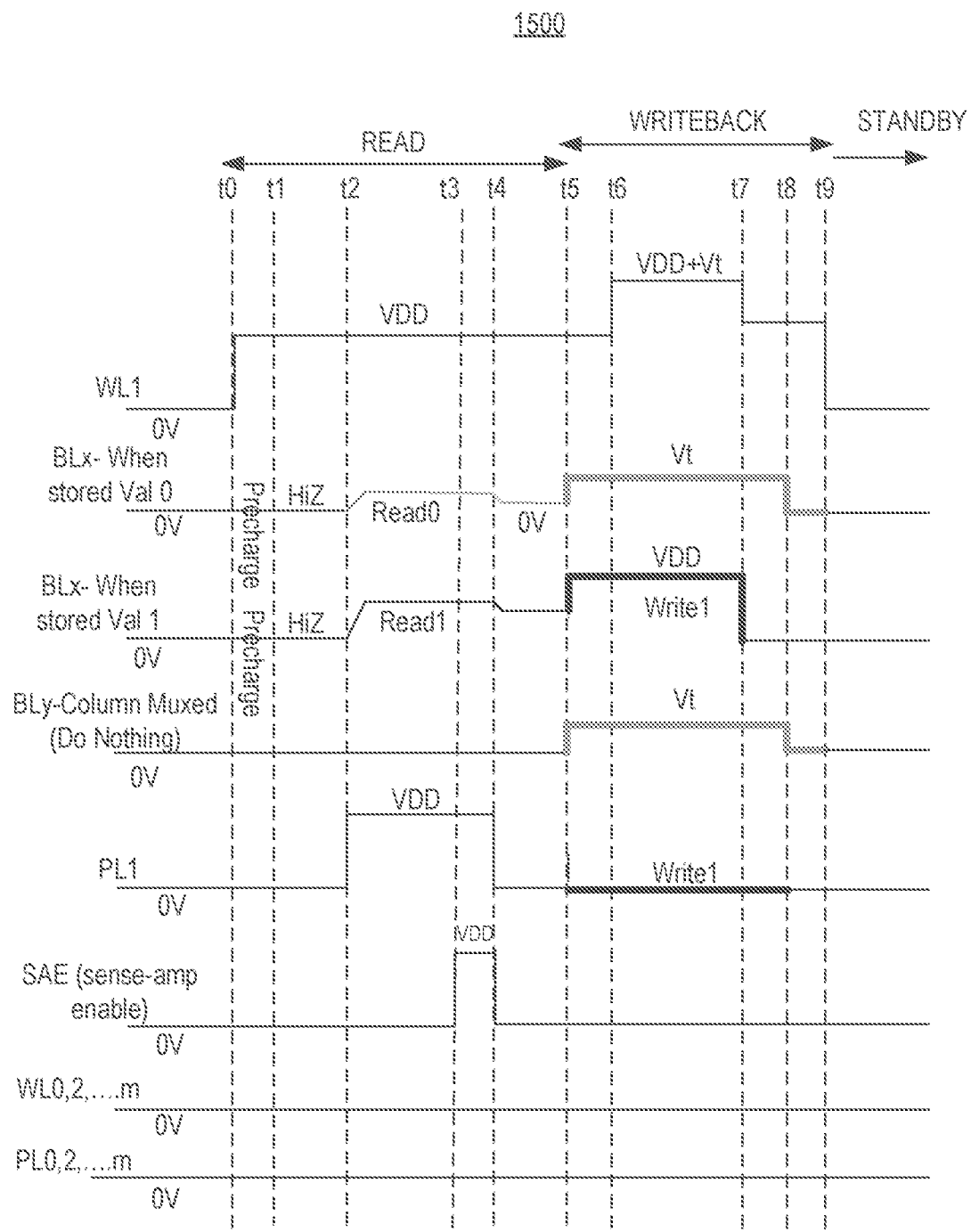
FIG. 15 illustrates a timing diagram of a read operation cycle for a 1T1C memory with WL parallel to PL, where a read phase is performed before a writeback phase, in accordance with at least one embodiment.

FIG. 15 illustrates timing diagram 1500 of a read operation cycle for a 1T1C memory with WL parallel to PL, where a read phase is performed before a writeback phase, in accordance with at least one embodiment. In at least one embodiment, read operation comprises a read phase, a writeback phase, and a standby phase. In at least one embodiment, writeback phase follows read phase. In at least one embodiment, standby phase follows writeback phase. Here, read phase extends from tine point t0 to t5, writeback base extends from time point t5 to t9, and standby phase extends from time point t9 onwards. In at least one embodiment, operations or events shown in timing diagram 1500 can be performed or controlled by hardware (e.g., one or more circuitries in a memory controller or logic described with reference to FIG. 7), software, or a combination of them. In at least one embodiment, several signals illustrated in timing diagram 1500 are digital signals in that they are either logic 1 or logic 0 levels. In at least one embodiment, some signals in timing diagram 1500 are analog signals such as signals at threshold voltage level (Vt) of access transistor MN and when bit-line voltage when bit-line is floated.

In at least one embodiment, read phase begins by asserting voltage on selected WL (e.g., WL1) to a nominal supply voltage level (e.g., Vdd). In at least one embodiment, a writeback scheme is implemented after read phase to restore data value stored in selected bit-cell. In at least one embodiment, writeback scheme is performed to mitigate destructive nature of read operation. In at least one embodiment, data which is read is also written back in writeback time window after read time window. In at least one embodiment, writeback scheme may not follow a read phase or operation immediately. In at least one embodiment, there may be one or more idle cycles between a read phase and a writeback operation. In at least one embodiment, there may be no writeback operation after read operation (e.g., when a write operation is expected to happen after read phase, or when read phase is not destructive or destructive enough to use a writeback operation).

In at least one embodiment, voltage on a selected PL (e.g., PL1) is asserted for capacitor of bit-cell which is being read (e.g., capacitor Cfe) between time point t2 and time point t4. In at least one embodiment, voltage on PL is asserted for a time period long enough for a sense amplifier to sense value stored on storage node coupled to capacitor Cfe. In at least one embodiment, sense amplifier enable signal (SAE) is asserted (e.g., to Vdd) within a pulse width of selected PL (e.g., PL1). In at least one embodiment, to read data from storage node, voltage on BL is first set or forced to zero volts (e.g., a precharged state) and then BL is allowed to float (e.g., BLx driver goes into high impedance state Z (HiZ)). In at least one embodiment, BL is precharged to a certain voltage or a programmable voltage. In at least one embodiment, when WL is selected, in conjunction with PL voltage, a field is created across capacitor Cfe.

In at least one embodiment, after BL driver is configured in a high impedance state, selected BL is floated, which allows sense amplifier to sense voltage on storage node via BL. In at least one embodiment, sense amplifier is configured to sense voltage on BL by comparing it to one or more thresholds. In at least one embodiment, when BLx charges to a first voltage level, a logic 0 is read (Read 0). In at least one embodiment, when BLx charges to a second voltage level (higher than first voltage level), a logic 1 is read (Read 1). In at least one embodiment, after sense amplifier is disabled (SAE is set to 0), voltage on selected BL is forced to zero volts. In at least one embodiment, after selected BL is forced to 0V, writeback process begins. In at least one embodiment, writeback process may not be needed if read operation is not a destructive read.

In at least one embodiment, selected bit-line (e.g., BLx) is set to 0V, and depending on whether a logic 1 or a logic 0 value is written during writeback to selected capacitor Cfe (via plate-line PLx), selected bit-line is toggled. In at least one embodiment, writeback scheme is same as write operation of FIG. 14. In at least one embodiment, writeback scheme is second phase (e.g., t2 through t5) of write operation of FIG. 14, which comprises logic 1 write operation (e.g., write 1 operation). In at least one embodiment, logic 0 write operation of first phase (e.g., t0 through t2) of write operation of FIG. 14 is effectively performed during read phase of FIG. 15 and may be skipped during read operation of FIG. 15.

In at least one embodiment, in writeback process, BL is charged to Vdd or set to 0V depending upon whether a logic 1 or a logic 0 is written back to selected bit-cell. In at least one embodiment, value written back to bit-cell is same value that sense amplifier detects when reading voltage on BL. In at least one embodiment, WL for unselected bit-cells is set to 0V (e.g., WL0, WL2 . . . WLm is set to 0 when WL1 is selected). In at least one embodiment, BL and PLs for unselected bit-cells may also be set to 0V. BLy-Column Muxed for bit-cells controlled by same word-line (e.g., WL1) that are column multiplexed because no new value is intended to be written to them, are adjusted to threshold voltage level Vt (e.g., threshold voltage of access transistor MN) in writeback process (e.g., between t5 and t8. In at least one embodiment, wear-leveling logic 706 is used for memory endurance.

Figure 16:
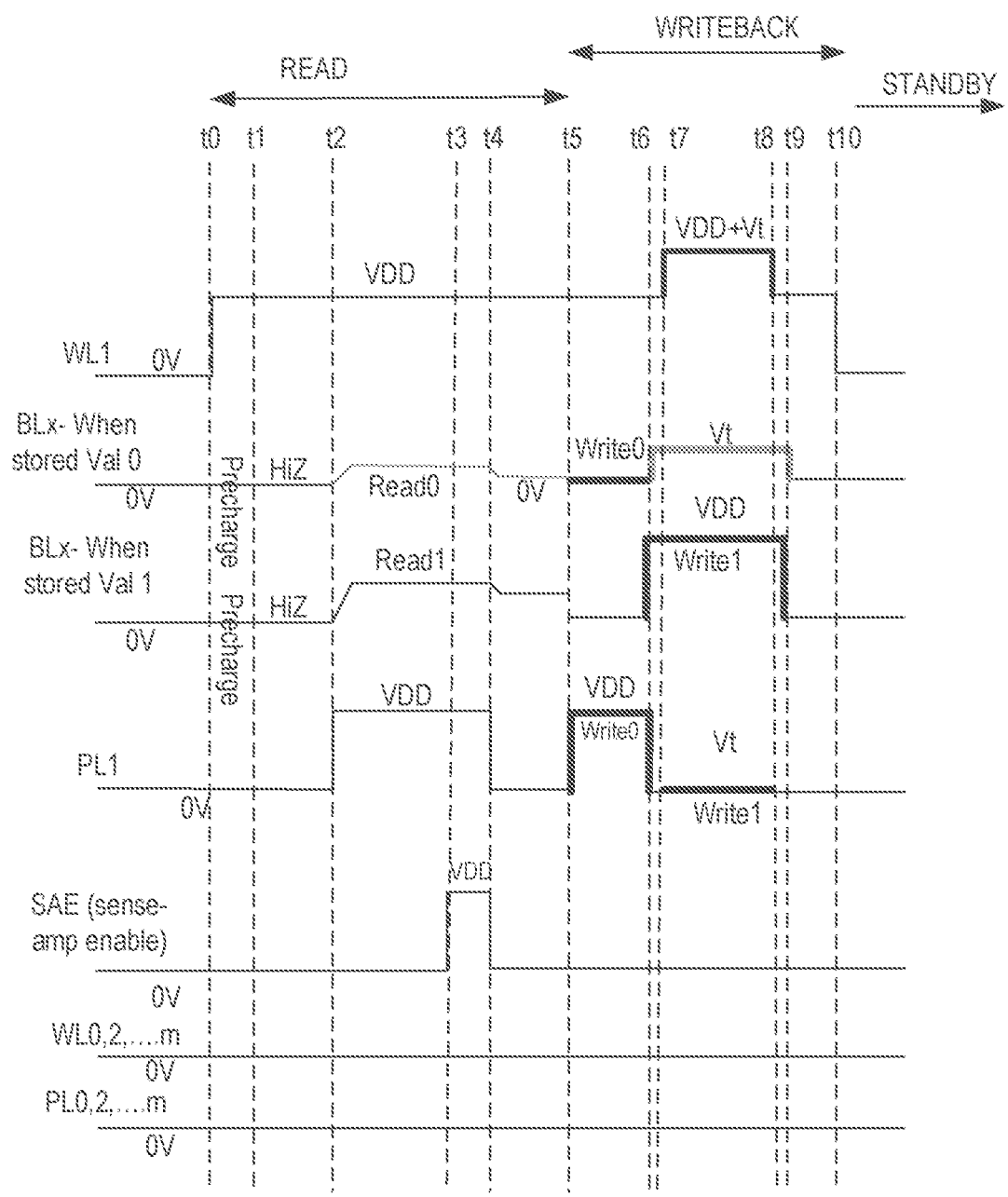
FIG. 16 illustrates a timing diagram of a read operation cycle for a 1T1C memory with WL parallel to PL, where a read phase is performed before a writeback phase and where writeback phase can write a logic 0 or a logic 1, in accordance with at least one embodiment.

FIG. 16 illustrates timing diagram 1600 of a read operation cycle for a 1T1C memory with WL parallel to PL, where a read phase is performed before a writeback phase and where writeback phase can write a logic 0 or a logic 1, in accordance with at least one embodiment. Timing diagram 1600 is like timing diagram 1500 but with writeback phase that can write logic 0 or logic 1 depending on logic value read from bit-cell during read phase. In at least one embodiment, writeback phase is write operation of FIG. 14, which is illustrated in timing diagram 1400.

Figure 17:
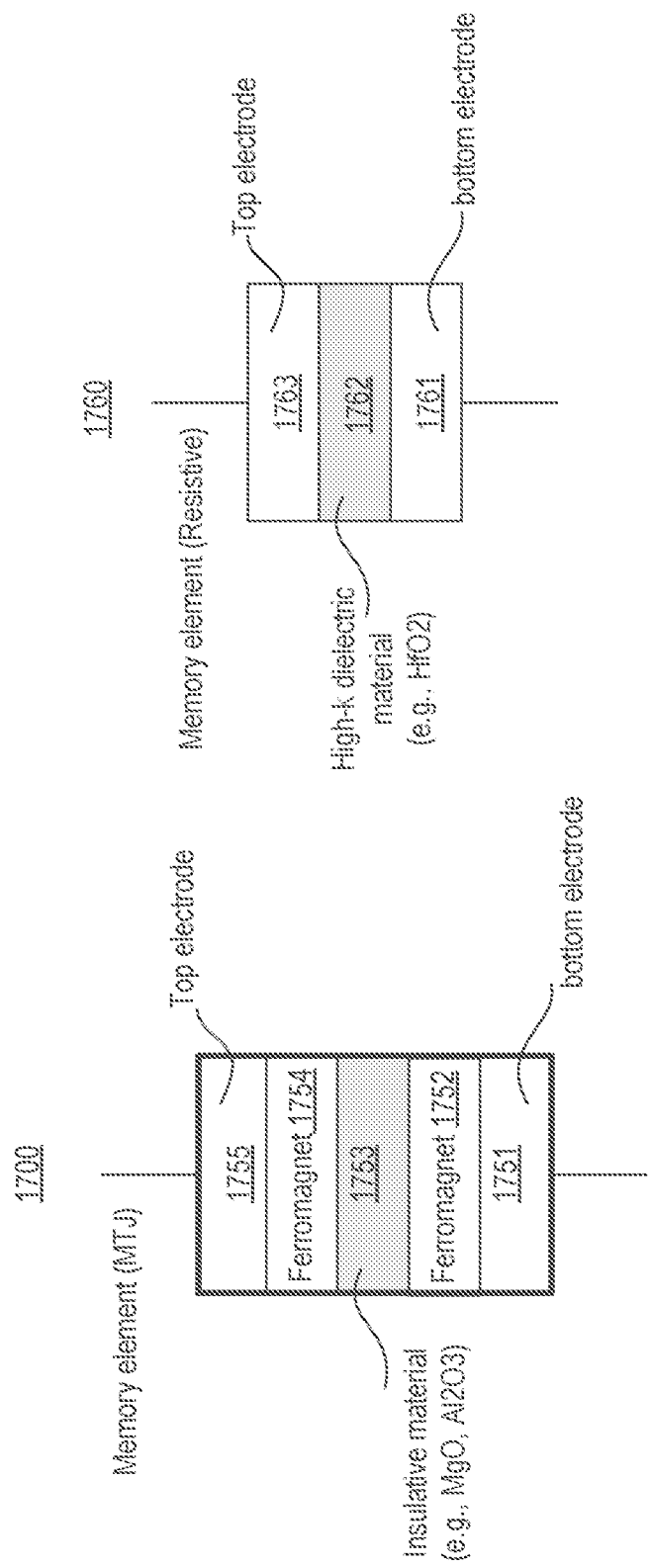
FIG. 17 illustrates memory elements (MEs) for use in memory bit-cells, in accordance with at least one embodiment.

FIG. 17 illustrates memory elements (MEs) for use in memory bit-cells, in accordance with at least one embodiment. In at least one embodiment, planar memory element structures are resistive elements. In at least one embodiment, planar memory element structures are magnetic tunnel junctions (MTJs). In at least one embodiment, planar memory element structures are phase change memory (PCM) memories.

In at least one embodiment, MTJ 1700 comprises a bottom electrode 1751, free ferromagnetic layer 1752, insulative material 1753 (e.g., tunnel barrier materials such as MgO, $Al_2O_3$, or $SrTiO_3$), fixed ferromagnetic layer 1754, and top electrode 1755. In at least one embodiment, free ferromagnetic layer 1752 comprises one or more of $CrO_2$, Heusler alloys, Fe, or CoFeB. In at least one embodiment, insulative material 1753 (also referred to as tunnel barrier) includes one of: MgO or AlOx (where x is a number or fraction), or $SrTiO_3$. In at least one embodiment, fixed ferromagnetic layer 1754 includes one of $CrO_2$, Heusler alloys, FeCo(001), CoFeB. In at least one embodiment, an anti-ferromagnetic layer (not shown) is formed over fixed ferromagnetic layer 1754. In at least one embodiment, anti-ferromagnetic (AFM) layer comprises Ru or Ir. In at least one embodiment, AFM layer comprises a super lattice of Co and Pt coupled with Ru or Ir. In at least one embodiment, bottom electrode 1751 and top electrode 1755 includes one or more of: Al, Ti, Cu, Ag, Pt, TiN, TaN, Al doped ZnO, Ga-doped ZnO, or indium tin oxide (ITO). In at least one embodiment, bottom electrode 1751 and top electrode 1755 are symmetric. In at least one embodiment, bottom electrode 1751 and top electrode 1755 are asymmetric. In at least one embodiment, bottom electrode 1751 and top electrode 1755 may have same materials as those discussed with reference to electrodes in FIG. 4B.

In at least one embodiment, resistive memory 1760 (ReRAM) comprises bottom electrode 1761, insulative material 1762, and top electrode 1763. In at least one embodiment, insulative material 1762 includes: $HfO_x$, $TiO_x$, TaOx, NiO, $ZnO_x$, $Zn_2TiO_4$, $KnO_x$, MgO, $AlO_x$, $ZrO_x$, $Cu_xO_y$, $SnO_z$, $GeO_x$, $LaO_x$, $YO_x$, $MoO_x$, or $CoO_x$ (where 'x' and 'y' are a number or a fraction). In at least one embodiment, insulative material 1762 for ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one embodiment, bottom electrode 1761 and top electrode 1763 includes one or more of: Al, Ti, Cu, Ag, Pt, TiN, TaN, Al doped ZnO, Ga-doped ZnO, or indium tin oxide (ITO). In at least one embodiment, bottom electrode 1761 and top electrode 1763 are symmetric. In at least one embodiment, bottom electrode 1761 and top electrode 1763 are asymmetric. In at least one embodiment, bottom electrode 1761 and top electrode 1763 may have same materials as those discussed with reference to electrodes in FIG. 4B.

In at least one embodiment, in ReRAM systems that use forming of filaments, an initial operation may begin by applying a voltage pulse with an increasing magnitude, between top electrode 1763 and bottom electrode 1761. In at least one embodiment, magnitude of voltage pulse may be substantially greater than a voltage level utilized to cycle ReRAM device during regular course of programming. In at least one embodiment, a high voltage pulse may be utilized to perform an intentional one-time breakdown process, known as forming. In at least one embodiment, forming process creates one or more conductive filaments that provide pathways for electron transport during device operation.

In at least one embodiment, resistive memory 1760 is a phase-change memory (PC-RAM). In at least one embodiment, resistive memory 1760 comprises bottom electrode 1761, insulative material 1762, and top electrode 1763. In at least one embodiment, insulative material 1762 is a phase-change material. In at least one embodiment, phase-change material comprises phase-change chalcogenides. In at least one embodiment, phase-change material includes one of: $(GeTe)m(Sb_2Te_3)n$, $Ge_2Sb_2Te_5$, $Ge_2Sb_2Te_4$, AgInSbTe, super lattices of GeTe, $Sb_2Te_3$, super lattices of $TiTe_2$ and $Sb_2Te_3$, $WSe_2$, $WS_2$, or $PtSe_2$ (where m and n are numbers or fractions). In at least one embodiment, phase-change material includes binary transition metal oxides such as NiO or $TiO_2$, perovskites such as $Sr(Zr)TiO_3$ or PCMO, solid-state electrolytes such as GeS, GeSe, $SiO_x$, or $Cu_2S$, organic materials such as A1DCN, or layered materials, such as hexagonal boron nitride.

In at least one embodiment, when ME structures are not capacitors (as those described with reference to at least one embodiment herein), current based pulsing scheme(s) are used to drive (e.g., write) and for sensing (e.g., read). In at least one embodiment, plate-lines flow current to configure or read ME structures. In at least one embodiment, ME structures may be a mix of various types of ME structures (e.g., ferroelectric based capacitors, paraelectric based capacitors, MTJ, ReRAM, or PC-RAM). In at least one embodiment, all ME structures for an array are of same type.

Figure 18:
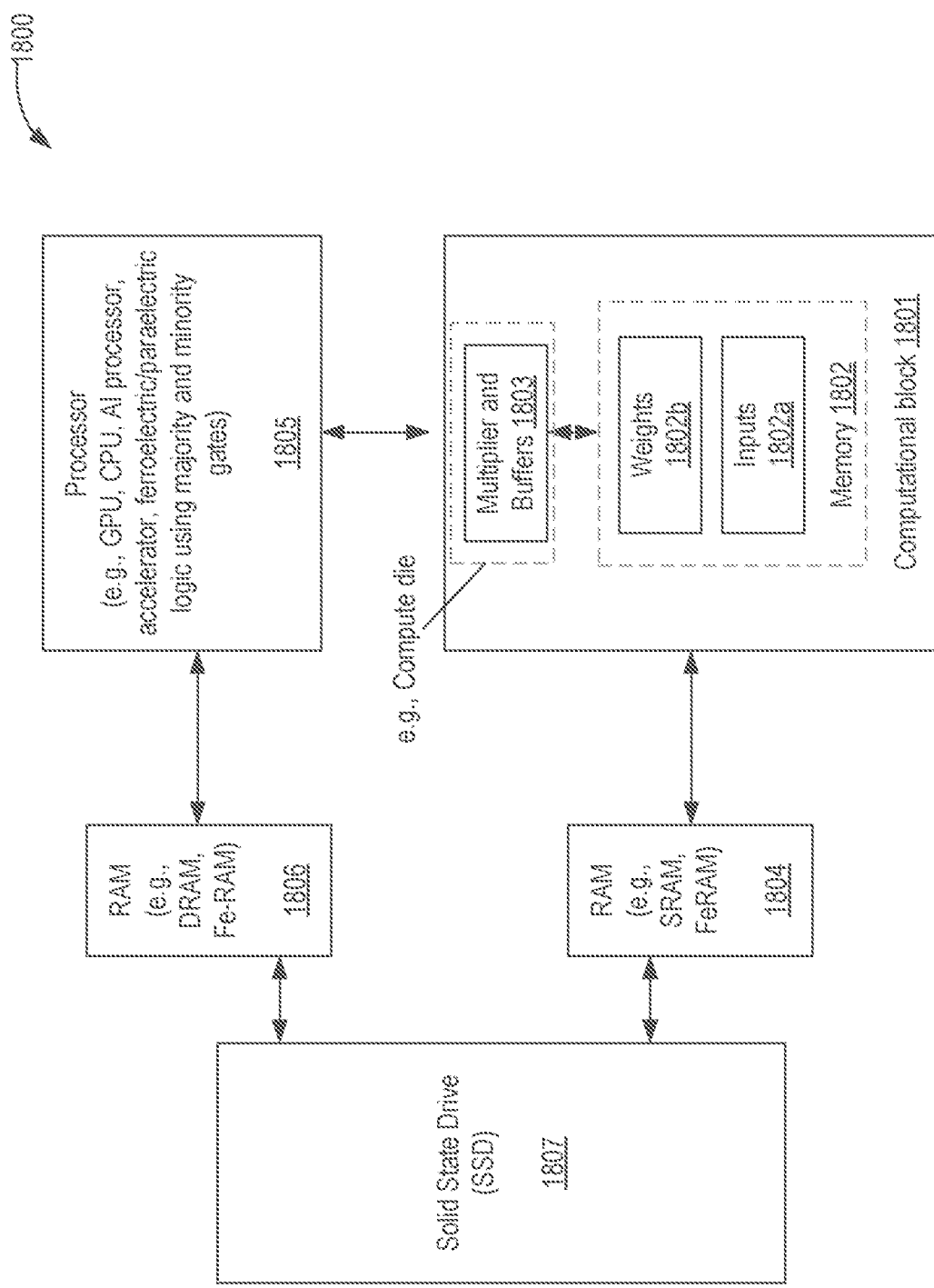
FIG. 18 illustrates a high-level architecture of an artificial intelligence (AI) machine comprising a compute die stacked over a memory die, where the memory die includes memory arrays that are written using time decoupled write operation, in accordance with at least one embodiment.

FIG. 18 illustrates a high-level architecture of an artificial intelligence (AI) machine comprising a compute die stacked over a memory die, where memory die includes memory arrays that are written using time decoupled write operation, in accordance with at least one embodiment.

In at least one embodiment, AI machine 1800 comprises computational block 1801 or processor having random-access memory (RAM) 1802 and multiplier and buffers 1803; first random-access memory 1804 (e.g., static RAM (SRAM), ferroelectric or paraelectric RAM (FeRAM), ferroelectric or paraelectric static random-access memory (FeSRAM)), main processor 1805, second random-access memory 1806 (dynamic RAM (DRAM), FeRAM), and solid-state memory or drive (SSD) 1807. In at least one embodiment, some or all components of AI machine 1800 are packaged in a single package forming a system-on-chip (SoC). In at least one embodiment, SoC can be configured as a logic-on-logic configuration, which can be in a 3D configuration or a 2.5D configuration.

In at least one embodiment, computational block 1801 is packaged in a single package and then coupled to processor 1805 and memories 1804, 1806, and 1807 on a printed circuit board (PCB). In at least one embodiment, computational block 1801 is configured as a logic-on-logic configuration, which can be in a 3D configuration or a 2.5D configuration. In at least one embodiment, computational block 1801 comprises a special purpose compute die 1803 or microprocessor. In at least one embodiment, compute die 1803 is a compute chiplet that performs a function of an accelerator or inference. In at least one embodiment, memory 1802 is DRAM which forms a special memory/cache for special purpose compute die 1803. In at least one embodiment, DRAM can be embedded DRAM (eDRAM) such as 1T1C (one transistor and one capacitor) based memories. In at least one embodiment, RAM 1802 is ferroelectric or paraelectric RAM (Fe-RAM).

In at least one embodiment, compute die 1803 is specialized for applications such as Artificial Intelligence, graph processing, and algorithms for data processing. In at least one embodiment, compute die 1803 further has logic computational blocks, for multipliers and buffers, a special data memory block (e.g., buffers) comprising DRAM, FeRAM, or a combination of them. In at least one embodiment, RAM 1802 has weights and inputs stored to improve computational efficiency. In at least one embodiment, interconnects between processor 1805 (also referred to as special purpose processor), first RAM 1804, and compute die 1803 are optimized for high bandwidth and low latency. In at least one embodiment, architecture of FIG. 18 allows efficient packaging to lower energy, power, or cost, and provides for ultra-high bandwidth between RAM 1804 and compute chiplet 1803 of computational block 1801.

In at least one embodiment, RAM 1802 is partitioned to store input data (or data to be processed) 1802a and weight factors 1802b. In at least one embodiment, input data 1802a is stored in a separate memory (e.g., separate memory die) and weight factors 1802b are stored in a separate memory (e.g., separate memory die).

In at least one embodiment, computational logic or compute chiplet 1803 comprises matrix multiplier, adder, concatenation logic, buffers, and combinational logic. In at least one embodiment, compute chiplet 1803 performs multiplication operation on inputs 1802a and weights 1802b. In at least one embodiment, weights 1802b are fixed weights. In at least one embodiment, processor 1805 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 1802. In at least one embodiment, input data that is to be analyzed using a trained model is processed by computational block 1801 with computed weights 1802b to generate an output (e.g., a classification result).

In at least one embodiment, first RAM 1804 is ferroelectric or paraelectric based SRAM. For example, a six transistor (6T) SRAM bit-cell having ferroelectric or paraelectric transistors are used to implement a non-volatile FeSRAM. In at least one embodiment, SSD 1807 comprises NAND flash cells. In at least one embodiment, SSD 1807 comprises NOR flash cells. In at least one embodiment, SSD 1807 comprises multi-threshold NAND flash cells.

In at least one embodiment, non-volatility of FeRAM is used to introduce new features such as security, functional safety, and faster reboot time of AI machine 1800. In at least one embodiment, non-volatile FeRAM is a low power RAM that provides fast access to data and weights. FeRAM 1804 can also serve as fast storage for computational block 1801 (which can be an inference die or an accelerator), which typically has low capacity and fast access requirements.

In at least one embodiment, FeRAM (FeDRAM or FeSRAM) includes ferroelectric or paraelectric material. In at least one embodiment, ferroelectric or paraelectric material may be in a transistor gate stack or in a capacitor of memory. In at least one embodiment, ferroelectric material can be any suitable low voltage FE material discussed herein. While at least one embodiment here is described with reference to ferroelectric material, at least one embodiment is applicable to any of nonlinear polar materials described herein.

Figure 19:
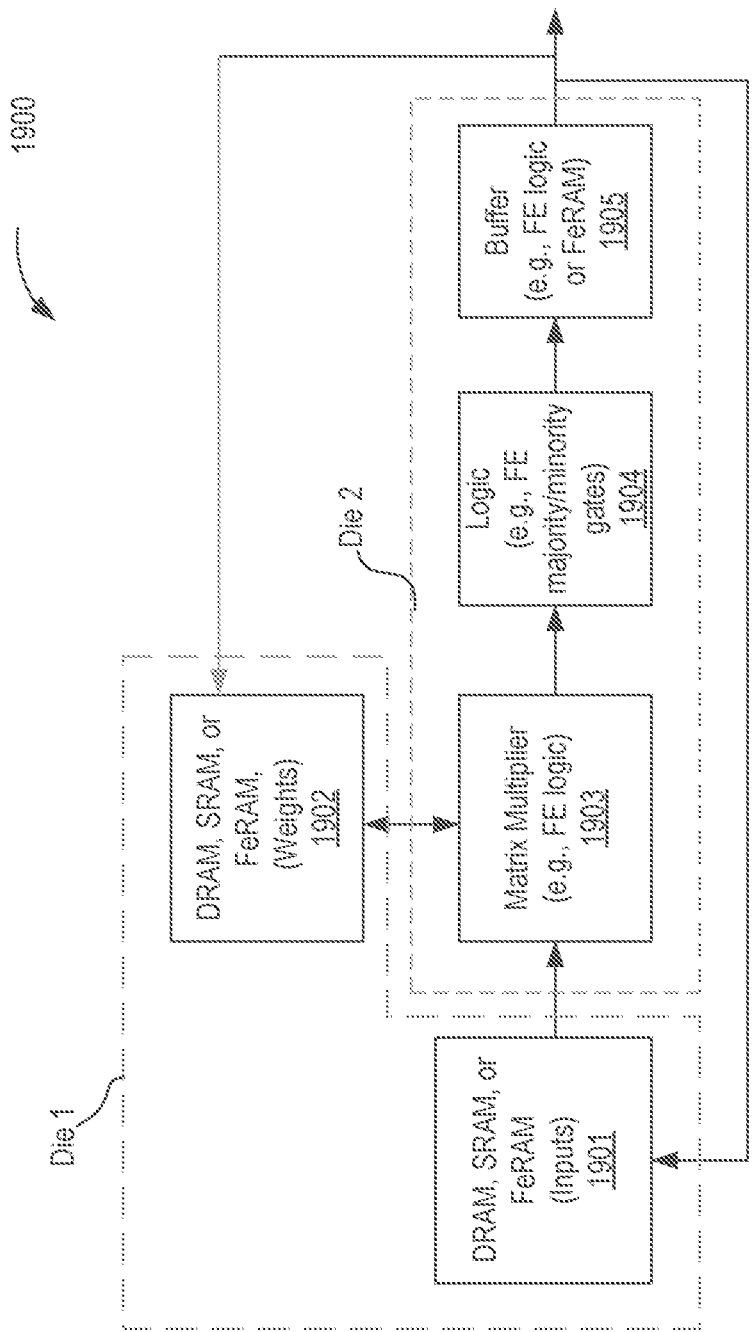
FIG. 19 illustrates an architecture of a computational block comprising a compute die stacked with a memory die, wherein the memory die includes memory arrays having bit-cells that are written using time decoupled write operation, in accordance with at least one embodiment.

FIG. 19 illustrates an architecture of a computational block comprising a compute die stacked with a memory die, wherein memory die includes memory arrays having bit-cells that are written using time decoupled write operation, in accordance with at least one embodiment. In at least one embodiment, architecture of FIG. 19 illustrates an architecture for a special purpose compute die where RAM memory buffers for inputs and weights are split on die-1 and logic and optional memory buffers are split on die-2.

In at least one embodiment, memory die (e.g., Die 1) is positioned below compute die (e.g., Die 2) such that a heat sink or thermal solution is adjacent to compute die. In at least one embodiment, memory die is embedded in an interposer. In at least one embodiment, memory die behaves as an interposer in addition to its basic memory function. In at least one embodiment, memory die is a high bandwidth memory (HBM) which comprises multiple dies of memories in a stack and a controller to control read and write functions to stack of memory dies. In at least one embodiment, memory die comprises a first die to store input data and a second die to store weight factors. In at least one embodiment, memory die is a single die that is partitioned such that first partition 1901 of memory die is used to store input data and second partition 1902 of memory die is used to store weights. In at least one embodiment, memory die comprises DRAM. In at least one embodiment, memory die comprises FE-SRAM or FE-DRAM. In at least one embodiment, memory die comprises MRAM. In at least one embodiment, memory die comprises SRAM. In at least one embodiment, memory partitions 1901 and 1902, or memory dies 1901 and 1902 include one or more of: DRAM, FE-SRAM, FE-DRAM, SRAM, and/or MRAM. In at least one embodiment, input data stored in memory partition or die 1901 is data to be analyzed by a trained model with fixed weights stored in memory partition or die 1902.

In at least one embodiment, compute die comprises ferroelectric or paraelectric logic (e.g., majority, minority, and/or threshold gates) to implement matrix multiplier 1903, logic 1904, and temporary buffer 1905. In at least one embodiment, matrix multiplier 1903 performs multiplication operation on input data 'X' and weights 'W' to generate an output 'Y'. In at least one embodiment, this output may be further processed by logic 1904. In at least one embodiment, logic 1904 performs a threshold operation, pooling and drop out operations, and/or concatenation operations to complete AI logic primitive functions.

In at least one embodiment, output of logic 1904 (e.g., processed output 'Y') is temporarily stored in buffer 1905. In at least one embodiment, buffer 1905 is memory such as one or more of: DRAM, Fe-SRAM, Fe-DRAM, MRAM, resistive RAM (Re-RAM) and/or SRAM. In at least one embodiment, buffer 1905 is part of memory die (e.g., Die 1). In at least one embodiment, buffer 1905 performs function of a re-timer. In at least one embodiment, output of buffer 1905 (e.g., processed output 'Y') is used to modify weights in memory partition or die 1902. In at least one embodiment, architecture 1900 not only operates as an inference circuitry, but also as a training circuitry to train a model. In at least one embodiment, matrix multiplier 1903 includes an array of multiplier cells, wherein first partition 1901 (e.g., DRAMs) and second partition 1902 (e.g., DRAMs) include arrays of memory bit-cells, respectively, wherein each multiplier cell is coupled to a corresponding memory bit-cell of first partition 1901 (e.g., DRAMs) and second partition 1902 (e.g., DRAMs). In at least one embodiment, architecture 1900 comprises an interconnect fabric coupled to array of multiplier cells such that each multiplier cell is coupled to interconnect fabric.

In at least one embodiment, architecture 1900 provides reduced memory access for compute die (e.g., die 2) by providing data locality for weights, inputs, and outputs. In at least one embodiment, data from and to AI computational blocks (e.g., matrix multiplier 1903) is locally processed within a same packaging unit. In at least one embodiment, architecture 1900 also segregates memory and logic operations onto a memory die (e.g., Die 1) and a logic die (e.g., Die 2), respectively, allowing for optimized AI processing. In at least one embodiment, desegregated dies allow for improved yield of dies. In at least one embodiment, a high-capacity memory process for Die 1 allows reduction of power of external interconnects to memory, reduces cost of integration, and results in a smaller footprint.

Figure 20:
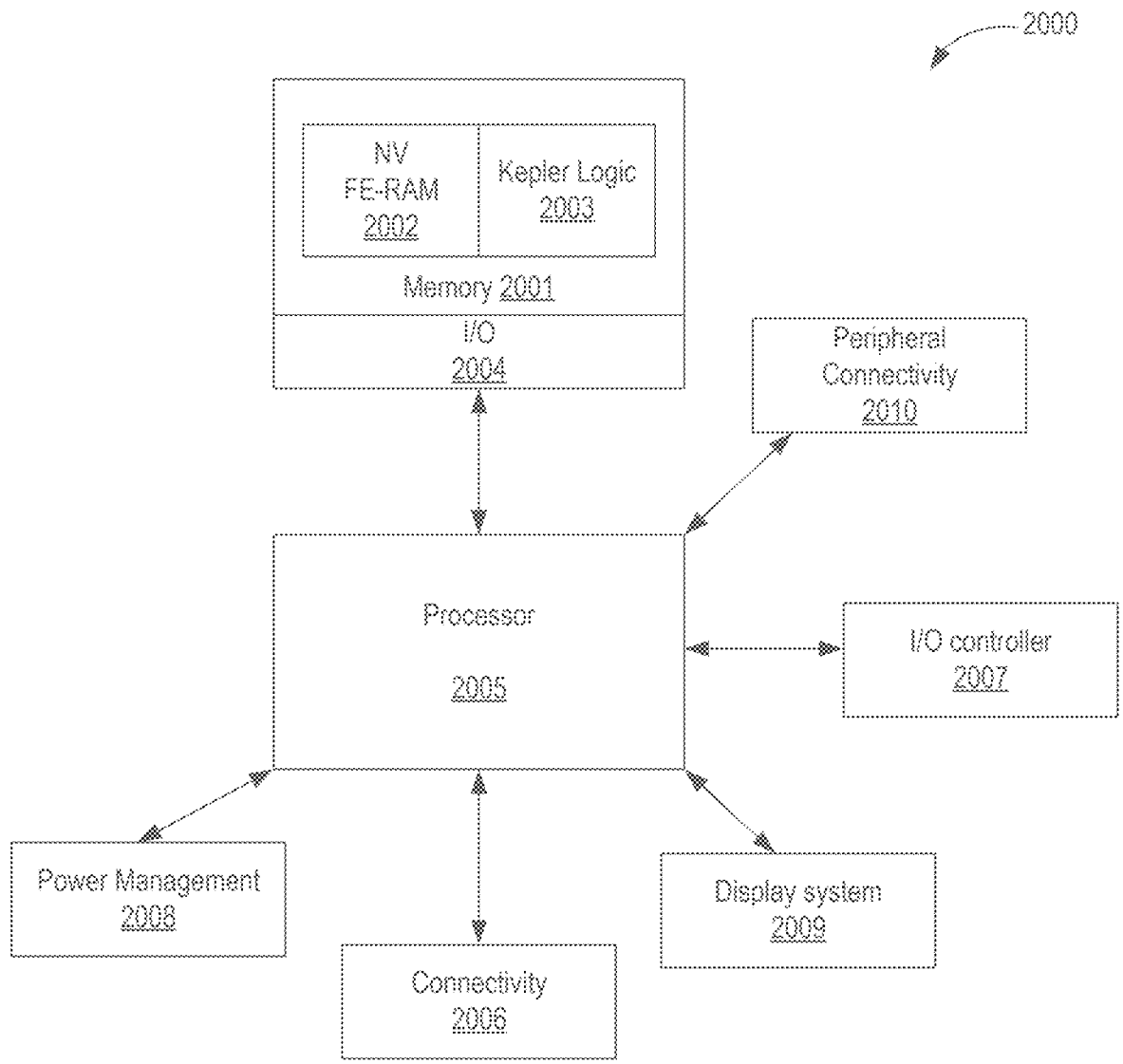
FIG. 20 illustrates a system-on-chip (SOC) that uses memory arrays including memory arrays having bit-cells that are written using time decoupled write operation, in accordance with at least one embodiment.

FIG. 20 illustrates a system-on-chip (SOC) that uses memory arrays including memory arrays having bit-cells that are written using time decoupled write operation, in accordance with at least one embodiment. In at least one embodiment, SoC 2000 comprises memory 2001 having static random-access memory (SRAM) or FE based random-access memory FE-RAM, or any other suitable memory. In at least one embodiment, memory can be non-volatile (NV) or volatile memory. In at least one embodiment, memory 2001 may also comprise logic 2003 to control memory 2002. In at least one embodiment, write and read drivers are part of logic 2003. In at least one embodiment, these drivers and other logic are implemented using majority or threshold gates discussed herein. In at least one embodiment, logic 2003 can comprise majority or threshold gates and traditional logic (e.g., CMOS based NAND, NOR etc.).

In at least one embodiment, SoC further comprises a memory I/O (input-output) interface 2004. In at least one embodiment, interface may be a double-data rate (DDR) compliant interface or any other suitable interface to communicate with a processor. In at least one embodiment, processor 2005 of SoC 2000 can be a single core or multiple core processor. In at least one embodiment, processor 2005 can be a general-purpose processor (CPU), a digital signal processor (DSP), or an Application Specific Integrated Circuit (ASIC) processor. In at least one embodiment, processor 2005 is an artificial intelligence (AI) processor (e.g., a dedicated AI processor, a graphics processor configured as an AI processor). In at least one embodiment, processor 2005 executes instructions that are stored in memory 2001.

In at least one embodiment, AI is a broad area of hardware and software computations where data is analyzed, classified, and then a decision is made regarding data. In at least one embodiment, a model describing classification of data for a certain property or properties is trained over time with large amounts of data. In at least one embodiment, process of training a model requires large amounts of data and processing power to analyze data. In at least one embodiment, when a model is trained, weights or weight factors are modified based on outputs of model. In at least one embodiment, once weights for a model are computed to a high confidence level (e.g., 95% or more) by repeatedly analyzing data and modifying weights to get expected results, model is deemed "trained." In at least one embodiment, trained model with fixed weights is then used to make decisions about new data. In at least one embodiment, training a model and then applying trained model for new data is hardware intensive activity. In at least one embodiment, AI processor has reduced latency of computing training model and using training model, which reduces power consumption of such AI processor systems.

In at least one embodiment, processor 2005 may be coupled to number of other chiplets that can be on same die as SoC 2000 or on separate dies. In at least one embodiment, these chiplets include connectivity circuitry 2006, I/O controller 2007, power management 2008, display system 2009, and connectivity circuitry 2006 (e.g., peripheral connectivity).

In at least one embodiment, connectivity circuitry 2006 represents hardware devices and software components for communicating with other devices. In at least one embodiment, connectivity circuitry 2006 may support various connectivity circuitries and standards. In at least one embodiment, connectivity circuitry 2006 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one embodiment, connectivity circuitry 2006 may support non-cellular standards such as WiFi.

In at least one embodiment, I/O controller 2007 represents hardware devices and software components related to interaction with a user. In at least one embodiment, I/O controller 2007 is operable to manage hardware that is part of an audio subsystem and/or display subsystem. In at least one embodiment, input through a microphone or other audio device can provide input or commands for one or more applications or functions of SoC 2000. In at least one embodiment, I/O controller 2007 illustrates a connection point for additional devices that connect to SoC 2000 through which a user might interact with system. In at least one embodiment, devices that can be attached to SoC 2000 might include microphone devices, speaker or stereo systems, video systems or other display devices, keyboard or keypad devices, or other I/O devices for use with specific applications such as card readers or other devices.

In at least one embodiment, power management 2008 represents hardware or software that performs power management operations, e.g., based at least in part on receiving measurements from power measurement circuitries, temperature measurement circuitries, charge level of battery, and/or any other appropriate information that may be used for power management. In at least one embodiment, by using majority and threshold gates discussed herein, non-volatility is achieved at output of this logic. In at least one embodiment, power management 2008 may accordingly put such logic into low power state without worry of losing data. In at least one embodiment, power management may select a power state according to Advanced Configuration and Power Interface (ACPI) specification for one or all components of SoC 2000.

In at least one embodiment, display system 2009 represents hardware (e.g., display devices) and software (e.g., drivers) components that provide a visual and/or tactile display for a user to interact with processor 2005. In at least one embodiment, display system 2009 includes a touch screen (or touch pad) device that provides both output and input to a user. In at least one embodiment, display system 2009 may include a display interface, which includes particular screen or hardware device used to provide a display to a user. In at least one embodiment, display interface includes logic separate from processor 2005 to perform at least some processing related to display.

In at least one embodiment, peripheral connectivity 2010 may represent hardware devices and/or software devices for connecting to peripheral devices such as printers, chargers, cameras, etc. In at least one embodiment, peripheral connectivity 2010 may support communication protocols, e.g., PCIe (Peripheral Component Interconnect Express), USB (Universal Serial Bus), Thunderbolt, High-Definition Multimedia Interface (HDMI), Firewire, etc.

In at least one embodiment, SoC 2000 includes a coherent cache or memory-side buffer chiplet (not shown) which include ferroelectric or paraelectric memory. In at least one embodiment, coherent cache, or memory-side buffer chiplet can be coupled to processor 2005 and/or memory 2001 as described herein (e.g., via silicon bridge or vertical stacking).

Here, "device" may generally refer to an apparatus according to context of usage of that term. In at least one embodiment, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of device may also be plane of an apparatus, which comprises device.

Throughout specification, and in claims, "connected" may generally refer to a direct connection, such as electrical, mechanical, or magnetic connection between things that are connected, without any intermediary devices.

Here, "coupled" may generally refer to a direct or indirect connection, such as a direct electrical, mechanical, or magnetic connection between things that are connected or an indirect connection, through one or more passive or active intermediary devices.

Here, "adjacent" may generally refer to a position of a thing being next to (e.g., immediately next to or close to with one or more things between them) or adjoining another thing (e.g., abutting it).

Here, "circuit" or "module" may generally refer to one or more passive and/or active components that are arranged to cooperate with one another to provide a desired function.

Here, "signal" may generally refer to at least one current signal, voltage signal, magnetic signal, or data/clock signal. Here, meaning of "a," "an," and "the" include plural references. Here, meaning of "in" includes "in" and "on."

Here, "analog signal" generally refers to any continuous signal for which time varying feature (variable) of signal is a representation of some other time varying quantity, e.g., analogous to another time varying signal.

Here, "digital signal" may generally refer to a physical signal that is a representation of a sequence of discrete values (a quantified discrete-time signal), for example of an arbitrary bit stream, or of a digitized (sampled and analog-to-digital converted) analog signal.

Here, "scaling" may generally refer to converting a design (schematic and layout) from one process technology to another process technology and subsequently being reduced in layout area. Here, "scaling" may generally refer to downsizing layout and devices within same technology node. Here, "scaling" may also generally refer to adjusting (e.g., slowing down or speeding up—e.g., scaling down, or scaling up respectively) of a signal frequency relative to another parameter, for example, power supply level.

Here, terms "substantially," "close," "approximately," "near," and "about," generally refer to being within +/−10% of a target value. For example, unless otherwise specified in explicit context of their use, terms "substantially equal," "about equal" and "approximately equal" mean that there is no more than incidental variation between among things so described. In at least one embodiment, such variation is typically no more than +/−10% of a predetermined target value.

Unless otherwise specified use of ordinal adjectives "first," "second," and "third," etc., to describe a common object, merely indicate that different instances of like objects are being referred to and are not intended to imply that objects so described must be in a given sequence, either temporally, spatially, in ranking or in any other manner.

For purposes of present disclosure, phrases "A and/or B" and "A or B" mean (A), (B), or (A and B). In at least one embodiment, phrase "A, B, and/or C" means (A), (B), (C), (A and B), (A and C), (B and C), or (A, B and C).

Here, "left," "right," "front," "back," "top," "bottom," "over," "under," and like in description and in claims, if any, are used for descriptive purposes and not necessarily for describing permanent relative positions. In at least one embodiment, "over," "under," "front side," "back side," "top," "bottom," "over," "under," and "on" as used herein refer to a relative position of one component, structure, or material with respect to other referenced components, structures, or materials within a device, where such physical relationships are noteworthy. In at least one embodiment, these terms are employed herein for descriptive purposes only and predominantly within context of a device z-axis and therefore may be relative to an orientation of a device. In at least one embodiment, a first material "over" a second material in context of a figure provided herein may also be "under" second material if device is oriented upside-down relative to context of figure provided. In context of materials, one material disposed over or under another may be directly in contact or may have one or more intervening materials. Moreover, one material disposed between two materials may be directly in contact with two layers or may have one or more intervening layers. In at least one embodiment, a first material "on" a second material is in direct contact with that second material. Similar distinctions are to be made in context of component assemblies.

Here, "between" may be employed in context of z-axis, x-axis or y-axis of a device. In at least one embodiment, a material that is between two other materials may be in contact with one or both of those materials, or it may be separated from both of other two materials by one or more intervening materials. In at least one embodiment, a material "between" two other materials may therefore be in contact with either of other two materials, or it may be coupled to other two materials through an intervening material. In at least one embodiment, a device that is between two other devices may be directly connected to one or both of those devices, or it may be separated from both of other two devices by one or more intervening devices.

Here, multiple non-silicon semiconductor material layers may be stacked within a single fin structure. In at least one embodiment, multiple non-silicon semiconductor material layers may include one or more "P-type" layers that are suitable (e.g., offer higher hole mobility than silicon) for P-type transistors. In at least one embodiment, multiple non-silicon semiconductor material layers may further include one or more "N-type" layers that are suitable (e.g., offer higher electron mobility than silicon) for N-type transistors. In at least one embodiment, multiple non-silicon semiconductor material layers may further include one or more intervening layers separating N-type from P-type layers. In at least one embodiment, intervening layers may be at least partially sacrificial, for example to allow one or more of a gate, source, or drain to wrap completely around a channel region of one or more of N-type and P-type transistors. In at least one embodiment, multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or back-end-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" may generally refer to a section of die that includes active region (e.g., where transistors are fabricated) and low-level metal layers and corresponding vias that are closer to active region (e.g., metal layer 5 and below in ten-metal stack die, for example).

Reference in specification to "an embodiment," "one embodiment," "in at least one embodiment," "some embodiments," or "other embodiments" means that a particular feature, structure, or characteristic described in connection with embodiments is included in at least some embodiments, but not necessarily all embodiments. Various appearances of "an embodiment," "one embodiment," "in at least one embodiment," or "some embodiments" are not necessarily all referring to same embodiments. If specification states a component, feature, structure, or characteristic "may," "might," or "could" be included, that particular component, feature, structure, or characteristic is not required to be included. If specification or claim refers to "a" or "an" element, that does not mean there is only one of elements. If specification or claims refer to "an additional" element, that does not preclude there being more than one of additional elements.

Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

While at least one embodiment has been described in conjunction with specific embodiments thereof, many alternatives, modifications and variations of such embodiments will be apparent to those of ordinary skill in art in light of foregoing description. At least one embodiment is intended to embrace all such alternatives, modifications, and variations as to fall within broad scope of appended claims.

In addition, well-known power/ground connections to integrated circuit (IC) chips and other components may or may not be shown within presented figures, for simplicity of illustration and discussion, and so as not to obscure any embodiment. Further, arrangements may be shown in block diagram form to avoid obscuring any embodiment, and also in view of fact that specifics with respect to implementation of such block diagram arrangements are highly dependent upon platform within which an embodiment is to be implemented (e.g., such specifics should be well within purview of one skilled in art). Where specific details (e.g., circuits) are set forth to describe example embodiments of disclosure, it should be apparent to one skilled in art that disclosure can be practiced without, or with variation of, these specific details. Description of an embodiment is thus to be regarded as illustrative instead of limiting.

In at least one embodiment, structures described herein can also be described as method(s) of forming those structures or apparatuses, and method(s) of operation of these structures or apparatuses. Following examples are provided that illustrate at least one embodiment. An example can be combined with any other example. As such, at least one embodiment can be combined with at least another embodiment without changing scope of an embodiment.

Example 1: An apparatus comprising: one or more circuitries to perform logic 0 write operation in a first phase and logic 1 write operation is a second phase for a plurality of bit-cells controlled by a word-line, wherein an individual bit-cell comprises: a transistor having a gate terminal coupled to the word-line; and a capacitor including non-linear polar material, wherein the capacitor has a first terminal coupled to a plate-line and a second terminal coupled to the transistor, wherein a source or drain terminal of the transistor is coupled to a bit-line.

Example 2 is the apparatus of any example herein, particularly example 1, claim 1, wherein the first phase is after the second phase or before the second phase.

Example 3 is the apparatus of any example herein, particularly example 1, wherein in the first phase, the one or more circuitries are to adjust a voltage on the word-line to be a supply level.

Example 4 is the apparatus of any example herein, particularly example 1, wherein in the second phase, the one or more circuitries are to boost a voltage on the word-line to be at a supply voltage level plus at least a threshold voltage of the transistor.

Example 5 is the apparatus of any example herein, particularly example 4, wherein the supply voltage level is a maximum operational voltage for a process node that includes the plurality of bit-cells.

Example 6 is the apparatus of any example herein, particularly example 1, wherein a voltage on the word-line is boosted, to a supply voltage level plus at least a threshold voltage of the transistor, via a power supply circuitry.

Example 7 is the apparatus of any example herein, particularly example 6, wherein the power supply circuitry is off-die or on-die.

Example 8: The apparatus of claim 1, wherein for a logic 1 write operation, the one or more circuitries are to adjust a voltage on the bit-line to be at zero voltage in the first phase, wherein the one or more circuitries are to adjust the voltage on the bit-line at a supply voltage level in the second phase.

Example 9 is the apparatus of any example herein, particularly example 8, wherein the one or more circuitries are to adjust a voltage on the word-line from a boosted supply level to a supply level prior to adjustment of the voltage on the bit-line from the supply voltage level to a ground voltage level.

Example 10 is the apparatus of any example herein, particularly example 1, wherein for a logic 0 write operation, the one or more circuitries are to adjust a voltage on the bit-line to be at zero voltage in the first phase, wherein the one or more circuitries are to adjust the voltage on the bit-line at threshold voltage level of the transistor in the second phase.

Example 11 is the apparatus of any example herein, particularly example 10, wherein the one or more circuitries are to adjust a voltage on the word-line from a boosted supply level to a supply level prior to adjustment of the voltage on the bit-line from the threshold voltage level to a ground voltage level.

Example 12 is the apparatus of any example herein, particularly example 1, wherein for the individual bit-cell, which is column multiplexed, the one or more circuitries are to adjust a voltage on the bit-line to be at threshold voltage level of the transistor in the first phase and the second phase.

Example 13 is the apparatus of any example herein, particularly example 12, wherein the one or more circuitries are to adjust a voltage on the word-line from a boosted supply level to a supply level prior to adjustment of the voltage on the bit-line from the threshold voltage level to a ground voltage level.

Example 14 is the apparatus of any example herein, particularly example 1, wherein for a logic 1 write operation, the one or more circuitries are to adjust the plate-line to 0V in the second phase.

Example 15 is the apparatus of any example herein, particularly example claim 1, wherein for a logic 0 write operation, the one or more circuitries are to adjust the plate-line to a supply voltage level in the first phase, wherein the one or more circuitries are to adjust the plate-line to a threshold voltage of the transistor in the second phase.

Example 16 is the apparatus of any example herein, particularly example 15, wherein the one or more circuitries are to adjust a voltage on the word-line from a boosted supply level to a supply level prior to adjustment of the voltage on the plate-line from a threshold voltage of the transistor to a ground voltage level.

Example 17 is the apparatus of any example herein, particularly example 1, wherein for the individual bit-cell, which is column multiplexed, the one or more circuitries are to adjust a voltage on the plate-line to be at a threshold voltage of the transistor in the first phase and the second phase.

Example 18 is the apparatus of any example herein, particularly example 17, wherein the one or more circuitries are to adjust a voltage on the word-line from a boosted supply level to a supply level prior to adjustment of the voltage on the plate-line from the threshold voltage to a ground voltage level.

Example 19 is the apparatus of any example herein, particularly example 1, wherein the non-linear polar material is one of a ferroelectric, paraelectric, or non-linear dielectric material.

Example 20 is the apparatus of any example herein, particularly example 1, wherein the non-linear polar material is doped with one or more elements of a 3d, 4d, 5d, 6d, 4f, and 5f series of a periodic table.

Example 21 is the apparatus of any example herein, particularly example 1, wherein the non-linear polar material includes one of: a perovskite material which includes one of: $BaTiO_3$, $PbTiO_3$, $KNbO_3$, or $NaTaO_3$; bismuth ferrite (BFO); barium titanate (BTO); BFO doped with one of: Sc, Ti, V, Cr, Mn, Fe, Co, Ni, Cu, or Zn; BTO doped with one of: Sc, Ti, V, Cr, Mn, Fe, Co, Ni, Cu, or Zn; LBFO doped with Mn; lead zirconium titanate (PZT), or PZT with a first doping material, wherein the first doping material is one of La, Nb, Mn, or 5d series elements; bismuth ferrite (BFO) with a second doping material, wherein the second doping material is one of lanthanum, elements from lanthanide series of a periodic table, or elements of a 3d, 4d, 5d, 6d, 4f, and 5f series of the periodic table; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type $h-RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as $Hf_{1-x} Ex O_y$, where E can be Al, Ca, Ce, Dy, Er, Gd, Ge, La, Sc, Si, Sr, Sn, Zr, or Y; $Al(1-x)Sc(x)N$, $Ga(1-x)Sc(x)N$, $Al(1-x)Y(x)N$ or $Al(1-x-y)Mg(x)Nb(y)N$, Ey doped $HfO_2$, where x includes one of: Al, Ca, Ce, Dy, Er, Gd, Ge, La, Sc, Si, Sr, Sn, or Y, wherein 'x' or 'y' is a fraction; or niobate type compounds $LiNbO_3$, $LiTaO_3$, lithium iron tantalum oxyfluoride, barium strontium niobate, sodium barium niobate, or potassium strontium niobate; an improper ferroelectric material which includes one of: [PTO/STO]n or [LAO/STO]n, wherein 'n' is between 1 and 100, or a paraelectric material that comprises $SrTiO_3$, $Ba(x) Sr(y)TiO_3$, $HfZrO_2$, Hf—Si—O, La-substituted $PbTiO_3$, or a PMN-PT based relaxor ferroelectrics; or a paraelectric material that comprises $SrTiO_3$, $Ba(x)Sr(y)TiO_3$, $HfZrO_2$, Hf—Si—O, or a PMN-PT based relaxor ferroelectrics.

Example 22: An apparatus comprising: one or more circuitries to decouple in time a logic 1 write operation from a logic 0 write operation for bit-cells controllable by a word-line, wherein an individual bit-cell includes: a transistor having a gate terminal coupled to the word-line; and a capacitor having a first terminal coupled to a plate-line and a second terminal coupled to the transistor, wherein a source or drain terminal of the transistor is coupled to a bit-line.

Example 23 is the apparatus of any example herein, particularly example 22, wherein the logic 1 write operation, the one or more circuitries are to boost a voltage on the word-line to be at a supply voltage level plus at least a threshold voltage of the transistor.

Example 24 is the apparatus of any example herein, particularly example 23, wherein the one or more circuitries is to cause logic 1 write operation to occur in a first write cycle phase, wherein the one or more circuitries is to cause logic 0 write operation to occur in a second write cycle phase, wherein the second write cycle phase is separate from the first write cycle phase.

Example 25: A system comprising: a memory to store instructions; a processor circuitry to execute the instructions; and a communication interface to allow the processor circuitry to communicate with another device, wherein the memory includes one or more circuitries to perform logic 0 write operation in a first phase and logic 1 write operation is a second phase for a plurality of bit-cells controlled by a word-line, wherein an individual bit-cell comprises: a transistor having a gate terminal coupled to the word-line; and a capacitor including non-linear polar material, wherein the capacitor has a first terminal coupled to a plate-line and a second terminal coupled to the transistor, wherein a source or drain terminal of the transistor is coupled to a bit-line.

Example 1a: An apparatus comprising: one or more circuitries to perform a read operation comprising a read operation phase followed by a write operation phase for a plurality of bit-cells controlled by a word-line, wherein an individual bit-cell comprises: a transistor having a gate terminal coupled to the word-line; and a capacitor including non-linear polar material, wherein the capacitor has a first terminal coupled to a plate-line and a second terminal coupled to the transistor, wherein a source or drain terminal of the transistor is coupled to a bit-line.

Example 2a is the apparatus of any example herein, particularly example 1a, wherein the one or more circuitries is to boost a voltage on the word-line to a supply level during the read operation phase.

Example 3a is the apparatus of any example herein, particularly example 1a, wherein the one or more circuitries is to boost a voltage on the plate-line to a supply voltage level within the read operation phase, and wherein a sense amplifier is to sense a voltage or current on the bit-line during a time when the voltage on the plate-line is boosted to the supply voltage level.

Example 4a is the apparatus of any example herein, particularly example 1a, wherein in the read operation phase the one or more circuitries is to: pre-charge the bit-line; place the bit-line to a high-impedance state after the bit-line is pre-charged; and float the bit-line to allow a voltage to develop on the bit-line.

Example 5a is the apparatus of any example herein, particularly example 1a, wherein the write operation phase is a writeback phase that writes a same logic value to the capacitor that is being read.

Example 6a is the apparatus of any example herein, particularly example 1a, wherein the write operation phase is a writeback phase that writes a logic 1 value to the capacitor that is being read and does not write a logic 0 value to the capacitor that is being read.

Example 7a is the apparatus of any example herein, particularly example 1a comprising a sense amplifier to sense a voltage on the bit-line during the read operation, wherein the one or more circuitries are to perform a logic 1 write operation if the sense amplifier indicates that a logic 1 is read from the capacitor via the bit-line.

Example 8a is the apparatus of any example herein, particularly example 7a, wherein the one or more circuitries are to boost a voltage on the word-line to be at a supply voltage level plus at least a threshold voltage of the transistor.

Example 9a is the apparatus of any example herein, particularly example 8a, wherein the supply voltage level is a maximum operational voltage for a process node that includes the plurality of bit-cells.

Example 10a is the apparatus of any example herein, particularly example 8a, wherein the one or more circuitries are to adjust voltage on the bit-line at a supply voltage level in the write operation phase.

Example 11a is the apparatus of any example herein, particularly example 7a, wherein the one or more circuitries are to adjust a voltage on the word-line from a boosted supply level to a supply level prior to adjustment of the voltage on the bit-line from a supply voltage level to a ground voltage level.

Example 12a is the apparatus of any example herein, particularly example 11a, wherein the one or more circuitries are to adjust a voltage on the word-line from a boosted supply level to a supply level prior to adjustment of the voltage on the plate-line from a threshold voltage of the transistor to a ground voltage level.

Example 13a is the apparatus of any example herein, particularly example 1a, wherein the one or more circuitries is to adjust a voltage on a sense-enable line to a threshold voltage of the transistor in the write operation phase.

Example 14a is the apparatus of any example herein, particularly example 1a, wherein the non-linear polar material is one of a ferroelectric, paraelectric, or non-linear dielectric material.

Example 15a is the apparatus of any example herein, particularly example 1a, wherein the non-linear polar material is doped with one or more elements of a 3d, 4d, 5d, 6d, 4f, and 5f series of a periodic table.

Example 16is an apparatus comprising: one or more circuitries to perform a read operation comprising a read operation phase followed by a write operation phase for a plurality of bit-cells controlled by a word-line, wherein an individual bit-cell comprises includes a capacitor including non-polar material.

Example 17a is the apparatus of any example herein, particularly example 16a, wherein the one or more circuitries are to cause a voltage across the capacitor to be at least a supply voltage plus a threshold voltage of a transistor in a write operation phase, wherein the transistor is coupled to the capacitor.

Example 18is the apparatus of claim 17a, wherein the one or more circuitries are to adjust a voltage on a sense-enable line to a threshold voltage of the transistor in the write operation phase.

Example 19a is the apparatus of any example herein, particularly example 17a comprising a sense amplifier to sense a voltage on a bit-line during the read operation, wherein the bit-line is coupled to the transistor, wherein the one or more circuitries are to perform a logic 1 write operation if the sense amplifier indicates that a logic 1 is read from the capacitor via the bit-line, and wherein the one or more circuitries is to skip a logic 0 write operation if the sense amplifier indicates that a logic 0 is read from the capacitor via the bit-line.

Example 20is a system comprising: a memory to store instructions; a processor circuitry to execute the instructions; and a communication interface to allow the processor circuitry to communicate with another device, wherein the memory includes: one or more circuitries to perform a read operation comprising a read operation phase followed by a write operation phase for a plurality of bit-cells controlled by a word-line, wherein an individual bit-cell comprises includes a capacitor including non-polar material.

An abstract is provided that will allow reader to ascertain nature and gist of technical disclosure. Abstract is submitted with an understanding that it will not be used to limit scope or meaning of claims. Following claims are hereby incorporated into detailed description, with each claim standing on its own as a separate embodiment.

We claim:

1. An apparatus comprising:
   one or more circuitries to perform logic 0 write operation in a first phase and logic 1 write operation in a second phase for a plurality of bit-cells controlled by a word-line, wherein during transition between the first phase and the second phase, the one or more circuitries are configured to;
   maintain the word-line at a boosted voltage level:
   precharge a bit-line to an intermediate voltage level; and
   pulse a plate-line to a supply voltage level before transitioning to a next phase, wherein an individual bit-cell comprises:
   a transistor having a gate terminal coupled to the word-line; and
   a capacitor including non-linear polar material, wherein the capacitor has a first terminal coupled to the plate-line and a second terminal coupled to the transistor, and wherein a source or drain terminal of the transistor is coupled to the bit-line.

2. The apparatus of claim 1, wherein the first phase is after the second phase or before the second phase.

3. The apparatus of claim 1, wherein in the first phase, the one or more circuitries are to adjust a voltage on the word-line to be a supply level.

4. The apparatus of claim 1, wherein in the second phase, the one or more circuitries are to boost a voltage on the word-line to be at a supply voltage level plus at least a threshold voltage of the transistor.

5. The apparatus of claim 4, wherein the supply voltage level is a maximum operational voltage for a process node that includes the plurality of bit-cells.

6. The apparatus of claim 1, wherein a voltage on the word-line is boosted, to a supply voltage level plus at least a threshold voltage of the transistor, via a power supply circuitry.

7. The apparatus of claim 6, wherein the power supply circuitry is off-die or on-die.

8. The apparatus of claim 1, wherein for a logic 1 write operation, the one or more circuitries are to adjust a voltage on the bit-line to be at zero voltage in the first phase, and wherein the one or more circuitries are to adjust the voltage on the bit-line at a supply voltage level in the second phase.

9. The apparatus of claim 8, wherein the one or more circuitries are to adjust a voltage on the word-line from a boosted supply level to a supply level prior to adjustment of the voltage on the bit-line from the supply voltage level to a ground voltage level.

10. The apparatus of claim 1, wherein for a logic 0 write operation, the one or more circuitries are to adjust a voltage on the bit-line to be at zero voltage in the first phase, and wherein the one or more circuitries are to adjust the voltage on the bit-line at threshold voltage level of the transistor in the second phase.

11. The apparatus of claim 10, wherein the one or more circuitries are to adjust a voltage on the word-line from a boosted supply level to a supply level prior to adjustment of the voltage on the bit-line from the threshold voltage level to a ground voltage level.

12. The apparatus of claim 1, wherein for the individual bit-cell, which is column multiplexed, the one or more circuitries are to adjust a voltage on the bit-line to be at threshold voltage level of the transistor in the first phase and the second phase.

13. The apparatus of claim 12, wherein the one or more circuitries are to adjust a voltage on the word-line from a boosted supply level to a supply level prior to adjustment of the voltage on the bit-line from the threshold voltage level to a ground voltage level.

14. The apparatus of claim 1, wherein for a logic 1 write operation, the one or more circuitries are to adjust the plate-line to 0V in the second phase.

15. The apparatus of claim 1, wherein for a logic 0 write operation, the one or more circuitries are to adjust the plate-line to a supply voltage level in the first phase, and wherein the one or more circuitries are to adjust the plate-line to a threshold voltage of the transistor in the second phase.

16. The apparatus of claim 15, wherein the one or more circuitries are to adjust a voltage on the word-line from a boosted supply level to a supply level prior to adjustment of the voltage on the plate-line from a threshold voltage of the transistor to a ground voltage level.

17. The apparatus of claim 1, wherein for the individual bit-cell, which is column multiplexed, the one or more circuitries are to adjust a voltage on the plate-line to be at a threshold voltage of the transistor in the first phase and the second phase.

18. The apparatus of claim 17, wherein the one or more circuitries are to adjust a voltage on the word-line from a boosted supply level to a supply level prior to adjustment of the voltage on the plate-line from the threshold voltage to a ground voltage level.

19. The apparatus of claim 1, wherein the non-linear polar material is one of a ferroelectric material, a paraelectric material, or a non-linear dielectric material.

20. The apparatus of claim 1, wherein the non-linear polar material is doped with one or more elements of a 3d, 4d, 5d, 6d, 4f, and 5f series of a periodic table.

21. The apparatus of claim 1, wherein the non-linear polar material includes one of:
a perovskite material which includes one of: $BaTiO_3$, $PbTiO_3$, $KNbO_3$, or $NaTaO_3$;
bismuth ferrite (BFO);
barium titanate (BTO);
BFO doped with one of Sc, Ti, V, Cr, Mn, Fe, Co, Ni, Cu, or Zn;
BTO doped with one of: Sc, Ti, V, Cr, Mn, Fe, Co, Ni, Cu, or Zn;
LBFO doped with Mn;
lead zirconium titanate (PZT) or PZT with a first doping material, wherein the first doping material is one of La, Nb, Mn, or 5d series elements;
bismuth ferrite (BFO) with a second doping material, wherein the second doping material is one of lanthanum, elements from lanthanide series of a periodic table, or elements of a 3d, 4d, 5d, 6d, 4f, and 5f series of the periodic table;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a hexagonal ferroelectric which includes one of: $YMnO_3$ or $LuFeO_3$;
hexagonal ferroelectrics of a type h-$RMnO_3$, wherein R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides;
hafnium oxides as $Hf_{(1-x)}E_xO_y$, where E can be Al, Ca, Ce, Dy, Er, Gd, Ge, La, Sc, Si, Sr, Sn, Zr, or Y, wherein in x and y are first and second fractions, respectively;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, $E_y$, wherein x and y are third and fourth fractions, respectively;
x doped $HfO_2$, where x includes one of Al, Ca, Ce, Dy, Er, Gd, Ge, La, Sc, Si, Sr, Sn, or Y;
niobate type compounds $LiNbO_3$, $LiTaO_3$, lithium iron tantalum oxyfluoride, barium strontium niobate, sodium barium niobate, or potassium strontium niobate;
an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectric; or
a paraelectric material that comprises $SrTiO_3$, $Ba_{(x)}Sr_{(y)}TiO_3$, $HfZrO_2$, Hf—Si—O, or a PMN-PT based relaxor ferroelectric.

22. An apparatus comprising:
one or more circuitries to decouple in time a logic 1 write operation from a logic 0 write operation for bit-cells controllable by a word-line, wherein the one or more circuitries are configured to:

maintain a minimum temporal separation between the logic 1 write operation and the logic 0 write operation:

perform voltage level pre-conditioning on a bit-line between write operations; and execute a plate-line reset sequence between consecutive write operations, wherein an individual bit-cell includes:

a transistor having a gate terminal coupled to the word-line; and a capacitor having a first terminal coupled to a plate-line and a second terminal coupled to the transistor, wherein a source or drain terminal of the transistor is coupled to the bit-line.

23. The apparatus of claim 22, wherein in the logic 1 write operation, the one or more circuitries are to boost a voltage on the word-line to be at a supply voltage level plus at least a threshold voltage of the transistor.

24. The apparatus of claim 23, wherein the one or more circuitries is to cause logic 1 write operation to occur in a first write cycle phase, wherein the one or more circuitries is to cause logic 0 write operation to occur in a second write cycle phase, wherein the second write cycle phase is separate from the first write cycle phase.

25. A system comprising:

a memory to store instructions;

a processor circuitry to execute the instructions; and a communication interface to allow the processor circuitry to communicate with another device, wherein the memory includes one or more circuitries to perform logic 0 write operation in a first phase and logic 1 write operation is a second phase for a plurality of bit-cells controlled by a word-line, and wherein during transition between the first phase and the second phase, the one or more circuitries are configured to:

maintain the word-line at a boosted voltage level:

precharge a bit-line to an intermediate voltage level; and pulse a plate-line to a supply voltage level before transitioning to a next phase, wherein an individual bit-cell comprises:

a transistor having a gate terminal coupled to the word-line; and a capacitor including non-linear polar material, wherein the capacitor has a first terminal coupled to the plate-line and a second terminal coupled to the transistor, and wherein a source or drain terminal of the transistor is coupled to the bit-line.

* * * * *